(12) United States Patent
Yasuda et al.

(10) Patent No.: US 9,979,379 B2
(45) Date of Patent: May 22, 2018

(54) MULTIPLEXER, RADIO FREQUENCY FRONT-END CIRCUIT, COMMUNICATION DEVICE, AND MULTIPLEXER DESIGN METHOD

(71) Applicant: Murata Manufacturing Co., Ltd., Nagaokakyo-shi, Kyoto-fu (JP)

(72) Inventors: Junpei Yasuda, Nagaokakyo (JP); Morio Takeuchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days. days.

(21) Appl. No.: 15/647,514

(22) Filed: Jul. 12, 2017

(65) Prior Publication Data

US 2018/0019509 A1   Jan. 18, 2018

(30) Foreign Application Priority Data

Jul. 13, 2016 (JP) ................. 2016-138772
Oct. 25, 2016 (JP) ................. 2016-208947
Jun. 2, 2017 (JP) ................. 2017-109977

(51) Int. Cl.
*H03H 9/72* (2006.01)
*H01P 1/213* (2006.01)

(52) U.S. Cl.
CPC ............. *H03H 9/72* (2013.01); *H01P 1/213* (2013.01)

(58) Field of Classification Search
CPC .......... H03H 9/70; H03H 9/703; H03H 9/706; H03H 9/72; H03H 9/725; H01P 1/213

USPC ............................................. 333/133; 455/83
See application file for complete search history.

(56) References Cited

U.S. PATENT DOCUMENTS

| | | | |
|---|---|---|---|
| 2002/0171507 A1* | 11/2002 | Ohashi | H03H 7/38 333/133 |
| 2006/0067254 A1* | 3/2006 | Mahbub | H03H 9/0576 370/282 |
| 2014/0321312 A1 | 10/2014 | Narahashi et al. | |
| 2015/0295596 A1 | 10/2015 | Wloczysiak et al. | |
| 2016/0197643 A1 | 7/2016 | Uejima | |

FOREIGN PATENT DOCUMENTS

| | | |
|---|---|---|
| JP | 09-172340 A | 6/1997 |
| JP | 2014-017750 A | 1/2014 |
| JP | 2015-204629 A | 11/2015 |
| WO | 2015/041125 A1 | 3/2015 |

* cited by examiner

*Primary Examiner* — Robert J Pascal
*Assistant Examiner* — Jorge Salazar, Jr.
(74) *Attorney, Agent, or Firm* — Keating & Bennett, LLP

(57) ABSTRACT

A multiplexer includes a n number (n is an integer equal to three or more) of filters that are individually provided in the n number of paths commonly connected at a common junction point, and that have different pass bands from one another. In the multiplexer, (n−1) filters among the n number of filters except for the first filter have impedances of which imaginary components cancel each other at a pass band frequency of the first filter when viewed from the common junction point in a state of the n number of paths being not commonly connected.

28 Claims, 31 Drawing Sheets

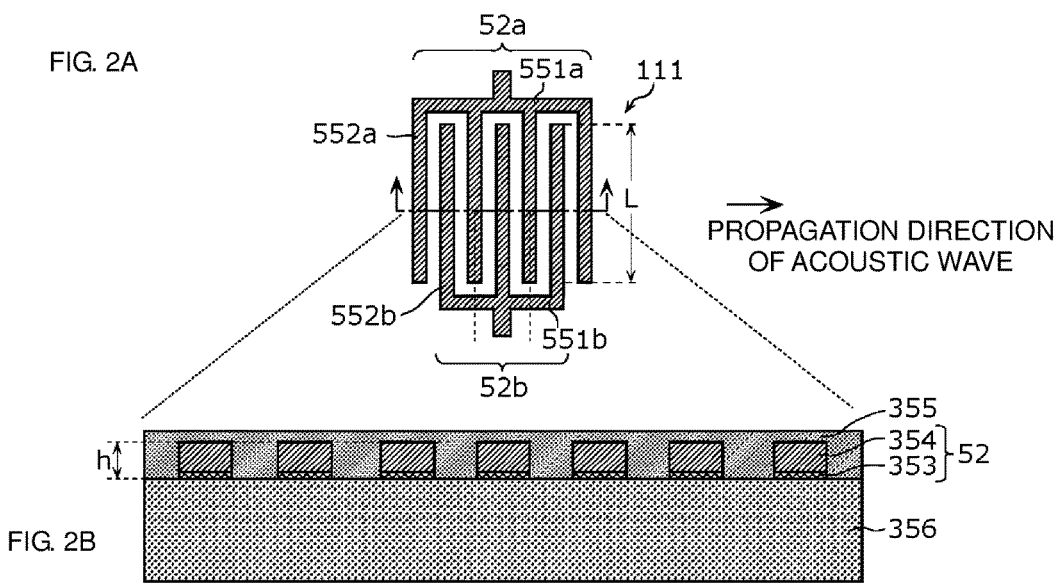

MULTIPLEXER, RADIO FREQUENCY FRONT-END CIRCUIT, COMMUNICATION DEVICE, AND MULTIPLEXER DESIGN METHOD

CROSS REFERENCE TO RELATED APPLICATIONS

This application claims the benefit of priority to Japanese Patent Application No. 2017-109977 filed on Jun. 2, 2017, Japanese Patent Application No. 2016-208947 filed on Oct. 25, 2016 and Japanese Patent Application No. 2016-138772 filed on Jul. 13, 2016. The entire contents of these applications are hereby incorporated herein by reference.

BACKGROUND OF THE INVENTION

1. Field of the Invention

The present invention relates to a multiplexer including a plurality of filters. The present invention further relates to a radio frequency front-end circuit, a communication device, and a multiplexer design method.

2. Description of the Related Art

A multiband system allowing one terminal to be adapted for a plurality of frequency bands is demanded in recent mobile communication devices. To meet such a demand, a multiplexer is developed which is capable of connecting a plurality of filters having different pass bands from one another to one antenna without using any switch interposed between the filters and the antenna.

In such a multiplexer, however, because a plurality of signal paths via a plurality of filters, respectively, are commonly-connected without interposition of any switch, the filters may affect one another and characteristics of the individual filters may degrade in some cases.

As a technique for avoiding the above-described degradation of the filter characteristics, it is proposed, in a multiplexer including two filters, to set an impedance of one of the two filters to be very high (so as to provide an open state) in a pass band of the other filter (also called a counterpart-side filter) when viewed from the commonly connected side (see, for example, Japanese Unexamined Patent Application Publication No. 9-172340).

When the number of commonly connected filters is two, namely when the number of frequencies of the pass bands of the counterpart-side filters with respect to one filter is one, the proposed configuration is useful in a point of allowing the frequency band to be easily brought into the open state. However, when the number of commonly connected filters is three or more, particularly when frequencies of two or more pass bands as the pass bands of the counterpart-side filters are apart from each other, a difficulty arises in bringing all of the pass bands of the counterpart-side filters into the open state. If the plurality of filters are commonly connected in a state where any pass band of the counterpart-side filters not in the open state is present, degradation of electrical characteristics (i.e., an increase of losses) may occur due to an influence of the impedance that appears to the pass band of the counterpart-side filter different from a pass band of the one filter.

SUMMARY OF THE INVENTION

Preferred embodiments of the present invention provide multiplexers each including three or more commonly connected filters and providing satisfactory electrical characteristics and effectively suppress losses. Other preferred embodiments of the present invention provide radio frequency front-end circuits, communication devices, and multiplexer design methods.

According to a preferred embodiment of the present invention, a multiplexer includes a number n (n is an integer equal to three or more) of filters that are individually provided in the n number of paths commonly connected at a common junction point, and that have different pass bands from one another, wherein (n−1) filters among the n number of filters except for a first filter have impedances of which imaginary components cancel each other at a pass band frequency of the first filter when viewed from the common junction point in a state of the n number of paths being not commonly connected.

With the feature that the (n−1) number of filters except for the first filter have the impedances described above, the combined impedance when viewing the (n−1) number of filters from the common junction point is harder to have an imaginary component at the pass band frequency of the first filter (i.e., in a pass band of the first filter). Accordingly, the combined impedance when viewing the n number of filters from the common junction point is less affected by the impedances of the (n−1) number of filters in the pass band of the first filter. As a result, the multiplexer according to this preferred embodiment provides satisfactory electrical characteristics (i.e., effectively suppresses losses).

In the above multiplexer, the impedances of the (n−1) number of filters may be in a complex conjugate relationship at the pass band frequency of the first filter when viewed from the common junction point in the state of the n number of paths being not commonly connected.

In the above multiplexer, at least two of the n number of filters except for the first filter may have impedances of which imaginary components cancel each other at the pass band frequency of the first filter when viewed from the common junction point in the state of the n number of paths being not commonly connected.

With the feature that the at least two filters except for the first filter have the impedances described above, the combined impedance when viewing the at least two filters from the common junction point is harder to have an imaginary component in the pass band of the first filter. Thus, by appropriately adjusting the impedances of the other (counterpart-side) filters, the combined impedance when viewing the n number of filters from the common junction point N is less affected in the pass band of the first filter by the impedances of the counterpart-side filters. As a result, satisfactory electrical characteristics are obtained.

In the above multiplexer, the impedances of the at least two filters may be in a complex conjugate relationship at the pass band frequency of the first filter when viewed from the common junction point in the state of the n number of paths being not commonly connected.

In the above multiplexer, the (n−1) filters may have impedances of which imaginary components cancel each other at the pass band frequency of the first filter on an open side, which is a region on the right side of a center of a Smith chart, when viewed from the common junction point in the state of the n number of paths being not commonly connected.

With the feature that the (n−1) number of filters except for the first filter have the impedances described above, the combined impedance when viewing the (n−1) number of filters from the common junction point is given as a high impedance, which is positioned on the right side of the center of the Smith chart, in the pass band of the first filter. Accordingly, leakage of a radio frequency signal in the pass band of the first filter to the above-mentioned (n−1) number of filters is effectively suppressed to achieve more satisfactory electrical characteristics in the path passing the first filter.

In the above multiplexer, the at least two filters may have impedances of which imaginary components cancel each other at the pass band frequency of the first filter on an open side, which is a region on a right side of a center of a Smith chart, when viewed from the common junction point in the state of the n number of paths being not commonly connected.

With the feature that the at least two filters except for the first filter have the impedances described above, the combined impedance when viewing those at least two filters from the common junction point is given as a high impedance in the pass band of the first filter. Accordingly, leakage of a radio frequency signal in the pass band of the first filter to the at least two filters is effectively suppressed such that more satisfactory electrical characteristics are obtained in the path passing the first filter.

In the above multiplexer, each of the n number of filters may be an acoustic wave filter including an acoustic wave resonator, and the pass band frequency of the first filter is different from a frequency range sandwiched between a resonant frequency and an antiresonant frequency of the acoustic wave resonator of each of the (n−1) filters.

With the feature that each of the n number of filters is an acoustic wave filter, sharpness of an attenuation slope in filter characteristics is increased in each filter. Furthermore, with the feature that the pass band frequency of the first filter is different from the frequency range sandwiched between the resonant frequency and the antiresonant frequency of the acoustic wave resonator of each of the (n−1) number of filters, the (n−1) number of filters act as capacitors at the pass band frequency of the first filter. Accordingly, leakage of the radio frequency signal in the pass band of the first filter to the (n−1) number of filters is effectively suppressed, such that more satisfactory electrical characteristics are obtained in the path passing the first filter.

In the above multiplexer, regarding (n−1) filters among the n number of filters except for a second filter, absolute values of the impedances at a pass band frequency of the second filter may be not less than about 500Ω, for example, when viewed from the common junction point in the state of the n number of paths being not commonly connected.

With the feature that the impedances of the (n−1) number of filters except for the second filter are infinite (have absolute values of not less than about 500Ω, for example) in the pass band of the second filter, the combined impedance when viewing the (n−1) number of filters from the common junction point can be given as a high impedance in the pass band of the second filter. Accordingly, leakage of a radio frequency signal in the pass band of the second filter to the above-mentioned (n−1) number of filters is effectively suppressed, such that more satisfactory electrical characteristics are able to be obtained in the path passing the second filter.

In the above multiplexer, (n−1) filters among the n number of filters except for a third filter may have impedances of which imaginary components cancel each other at a pass band frequency of the third filter when viewed from the common junction point in the state of the n number of paths being not commonly connected.

With the feature that the (n−1) number of filters except for the third filter have the impedances described above, the combined impedance when viewing the (n−1) number of filters from the common junction point is harder to have an imaginary component at the pass band frequency of the third filter (i.e., in a pass band of the third filter). Accordingly, the combined impedance when viewing the n number of filters from the common junction point is less affected by the impedances of the above-mentioned (n−1) number of filters. As a result, the multiplexer according to this preferred embodiment realizes low losses in the path passing the third filter as well, and provides more satisfactory electrical characteristics.

In the above multiplexer, the impedances of (n−1) filters among the n number of filters except for the third filter may be in a complex conjugate relationship at the pass band frequency of the third filter when viewed from the common junction point in the state of the n number of paths being not commonly connected.

In the above multiplexer, n=3 may be satisfied, the n number of filters may be a first filter having a first frequency band as a pass band, a second filter having a second frequency band as a pass band, and a third filter having a third frequency band as a pass band, and the second filter and the third filter may have impedances of which imaginary components cancel each other in the first frequency band when viewed from the common junction point in the state of the n number of paths being not commonly connected.

With those features, the combined impedance when viewing the second filter and third filter from the common junction point is harder to have an imaginary component at the pass band frequency of the first filter. Accordingly, the combined impedance when viewing the three filters from the common junction point is less affected by the impedances of the second filter and the third filter. As a result, a triplexer capable of providing satisfactory electrical characteristics is able to be realized.

In the above multiplexer, the impedance of the second filter in the first frequency band and the impedance of the third filter in the first frequency band may be in a complex conjugate relationship when viewing a side including the n number of filters from the common junction point in the state of the n number of paths being not commonly connected.

In the above multiplexer, the first filter and the second filter may have impedances of which imaginary components cancel each other in the third frequency band when viewed from the common junction point in the state of the n number of paths being not commonly connected.

With that feature, the combined impedance when viewing the first filter and second filter from the common junction point is harder to have an imaginary component at the pass band frequency of the third filter (i.e., in the pass band of the third filter). Accordingly, the combined impedance when viewing the three filters from the common junction point is less affected by the impedances of the first filter and the second filter. Thus, the multiplexer according to this preferred embodiment realizes low losses in the path passing the third filter as well. As a result, a triplexer capable of providing more satisfactory electrical characteristics is able to be realized.

In the above multiplexer, the impedance of the first filter in the third frequency band and the impedance of the second filter in the third frequency band may be in a complex conjugate relationship when viewing the side including the n number of filters from the common junction point in the state of the n number of paths being not commonly connected.

In the above multiplexer, an impedance of the first filter in the second frequency band and an impedance of the third filter in the second frequency band may have absolute values of not less than about 500Ω when viewing a side including the n number of filters from the common junction point in the state of the n number of paths being not commonly connected.

With that feature, the combined impedance when viewing the first filter and the third filter from the common junction point is given as a high impedance in the pass band of the second filter. Accordingly, leakage of the radio frequency signal in the pass band of the second filter to the first filter and the third filter is effectively suppressed, such that more satisfactory electrical characteristics are able to be obtained in the path passing the second filter. As a result, a triplexer capable of providing more satisfactory electrical characteristics is able to be realized.

In the above multiplexer, when the pass bands of the n number of filters are arrayed in order of frequency, the pass band frequency of the first filter corresponds to a band other than the pass bands that are positioned at a lowest frequency level and a highest frequency level.

Here, in trying to realize low losses in the filter characteristics of all the n number of filters, regarding the filter that has the pass band positioned at the lowest frequency level or the highest frequency level, the imaginary components of the impedances of the counterpart-side filters are relatively small in the pass band of the relevant filter. Thus, low losses are able to be comparatively easily realized in the relevant filter. However, regarding the filter that has the pass band positioned at a level other than the lowest or highest frequency level, the imaginary components of the impedances of the counterpart-side filters tend to increase in the pass band of the relevant filter. Such a phenomenon is more significant particularly when frequency intervals among the number n of pass bands are large. Accordingly, low losses are able to be realized in the filter characteristics of all the n number of filters when the above-described complex conjugate relationship is satisfied with respect to the (n−1) number of filters except for the first filter that has the pass band other than those positioned at the lowest frequency level and the highest frequency level. Thus, low losses are able to be realized in all the n number of paths.

The above multiplexer may further include a phase adjustment circuit that is disposed between the common junction point and at least one among the n number of filters.

With the provision of the phase adjustment circuit, the above-described complex conjugate relationship is able to be realized easily.

In the above multiplexer, the at least one filter may be a band rejection filter, and the phase adjustment circuit may be an inductor connected between the common junction point and the band rejection filter in series in the path in which the band rejection filter is disposed.

With the provision of the phase adjustment circuit that includes the above-mentioned inductor connected in series, the impedance when viewing the side including the band rejection filter from the common junction point in the state not under the common connection is shifted to the inductive side at each of the pass band frequencies of the counterpart-side filters with respect to the band rejection filter. Therefore, even when the impedances of the n number of filters are inductive such as represented by the case where the n number of filters are each an acoustic wave filter, the impedance of the band rejection filter and the impedance of at least one other filter are able to be brought into the complex conjugate relationship at the pass band frequency of the first filter. As a result, it is possible to obtain satisfactory electrical characteristics (namely, to suppress losses) in the multiplexer equipped with the n number of filters including the band rejection filter.

In the above multiplexer, the n number of filters may include at least two bandpass filters having pass band frequencies that fall within an attenuation band frequency range of the band rejection filter.

In other words, the pass band frequency of the band rejection filter on the lower frequency side may be set to be lower than those of the counterpart-side filters (at least two bandpass filters here). With that setting, the impedance when viewing the band rejection filter side from the common junction point in the state not under the common connection before adding the above-mentioned inductor is rotated clockwise to advance the phase on the Smith chart at each of the pass band frequencies of the counterpart-side filters.

Here, the phase of the impedance when viewing the band rejection filter side from the common junction point in the state not under the common connection after adding the above-mentioned inductor is advanced to a larger extent on the Smith chart at each of the pass band frequencies of the counterpart-side filters as an inductance value of the inductor increases. However, because the inductor is connected in series in the path through which a radio frequency signal is transferred, an increase of the inductance value increases losses in the pass band of the band rejection filter.

On the other hand, according to this preferred embodiment, regarding the band rejection filter before adding the inductor, the impedances at the pass band frequencies of the counterpart-side filters are able to be rotated clockwise on the Smith chart. Thus, the impedance when viewing the band rejection filter side from the common junction point in the state not under the common connection is able to be shifted to the inductive side at each of the pass band frequencies of the counterpart-side filters by adding the inductor having a relatively small inductance value. As a result, the losses in the pass band of the band rejection filter are effectively suppressed while satisfactory electrical characteristics are ensured.

In the above multiplexer, the band rejection filter may be an acoustic wave filter including one or more acoustic wave resonators, and one of the one or more acoustic wave resonators of the band rejection filter, the one being positioned closest to the common junction point, may be a parallel resonator that is connected in series in a path interconnecting the path in which the band rejection filter is disposed and a ground.

When the one acoustic wave resonator in the band rejection filter, which is positioned closest to the common junction point, is a parallel resonator, the impedance when viewing the band rejection filter side from the common junction point in the state not under the common connection before adding the inductor is rotated clockwise to advance the phase on the Smith chart at each of the pass band frequencies of the counterpart-side filters. Accordingly, as in the above preferred embodiment, the losses in the pass band of the band rejection filter is effectively suppressed while satisfactory electrical characteristics are ensured.

In the above multiplexer, the phase adjustment circuit may be an LC matching circuit including one or more inductors and one or more capacitors.

With the phase adjustment circuit being an LC matching circuit, regarding the filter in which the impedance matching is not established in its own pass band in the state not including the phase adjustment circuit, adjustment is able to be made in such a manner that the impedances satisfy the above-described complex conjugate relationship in the pass bands of the counterpart-side filters while the impedance matching is established in its own pass band.

In the above multiplexer, the phase adjustment circuit may include a capacitor connected in series in at least one of the paths in which the at least one filter is disposed, and an inductor connected in series in a path interconnecting the at least one path and a ground.

The phase adjustment circuit described above also provides similar advantageous effects to those obtained with the above-mentioned LC matching circuit.

In the above multiplexer, the phase adjustment circuit may be a microstripline connected in series in at least one of the paths in which the at least one filter is disposed.

Since that type of phase adjustment circuit does not include impedance elements such as an inductor and a capacitor, the configuration of the multiplexer is simplified, and man-hours needed in a manufacturing process are able to be reduced corresponding to the simplified configuration.

In the above multiplexer, the pass band of the first filter may be apart from the pass bands of (n−1) filters among the n number of filters except for the first filter in excess of a pass band width of the first filter.

When the above-mentioned frequency relationship is satisfied, it is generally quite difficult to realize low losses because of high difficulty in reducing the imaginary component of the impedance of each of the (n−1) number of filters that are the counterpart-side filters with respect to the first filter. According to this preferred embodiment, however, by setting conditions to satisfy the above-described complex conjugate relationship, low losses are able to be realized in the filter characteristics of the first filter for which it is quite difficult to reduce the losses.

In the above multiplexer, a CA (carrier aggregation) technique of simultaneously transmitting and receiving radio frequency signals in a plurality of frequency bands may be applied to the multiplexer, and the n number of filters may perform filtering of the radio frequency signals at the same time.

In the above multiplexer, the n number of filters may be three filters, and the three filters may be a filter having a pass band given as Band 3 of LTE (Long Term Evolution), a filter having a pass band given as Band 1 of the LTE, and a filter having a pass band given as Band 7 of the LTE, for example.

According to another preferred embodiment of the present invention, a radio frequency front-end circuit includes one of the above-described multiplexers, and an amplifier circuit connected to the one multiplexer.

As a result, a radio frequency front-end circuit capable of providing satisfactory electrical characteristics and being adapted for three or more multiple bands is able to be realized.

According to still another preferred embodiment of the present invention, a communication device includes an RF signal processing circuit that processes radio frequency signals transmitted and received via an antenna element, and the above-described radio frequency front-end circuit that transfers the radio frequency signals between the antenna element and the RF signal processing circuit.

As a result, a communication device capable of providing satisfactory electrical characteristics and being adapted for three or more multiple bands is able to be realized.

Still another preferred embodiment of the present invention provides a multiplexer design method. The multiplexer design method according to the still another preferred embodiment of the present invention is a method of designing a multiplexer including a number n (n is an integer equal to three or more) of filters that are individually provided in the n number of paths commonly connected at a common junction point, and that have different pass bands from one another, the method including a first step of designing a first filter among the n number of filters, and a second step of designing (n−1) filters among the n number of filters except for the first filter, wherein in the second step, the (n−1) number of filters are designed such that imaginary components of impedances of the (n−1) number of filters cancel each other at a pass band frequency of the first filter when viewing a side including the n number of filters from a point, which is part of the n number of paths and which is to be the common junction point.

With the multiplexers, etc. according to the preferred embodiments of the present invention, satisfactory electrical characteristics are obtained in the multiplexers including a plurality of three or more commonly connected filters.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A and 2B schematically illustrate, by way of example, a resonator defining each of filters according to the first preferred embodiment of the present invention; specifically, FIG. 2A represents a plan view and FIG. 2B represents a sectional view.

DETAILED DESCRIPTION OF THE PREFERRED EMBODIMENTS

Figure 1A:
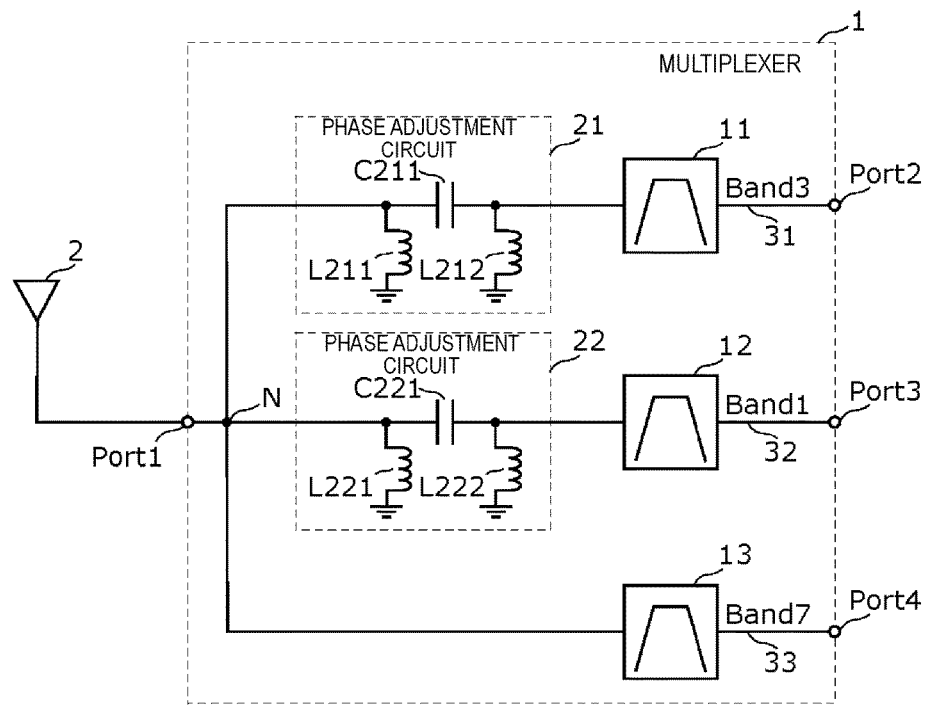
FIG. 1A is a block diagram of a multiplexer according to a first preferred embodiment of the present invention.

Preferred embodiments of the present disclosure will be described in detail below with reference to practical examples and drawings. It is to be noted that the following preferred embodiments represent general or specific examples. Thus, numerical values, shapes, materials, components, arrangements and connection forms of the components, and so on, which are described in the following preferred embodiments, are merely illustrative, and they do not limit the scope of the present invention. Sizes of the components illustrated in the drawings or size ratios between those components are not always accurate in a strict sense. In the following description, substantially the same components or members are denoted by the same reference sings, and duplicate description of those components or members is omitted or simplified in some cases. Moreover, in the following description, the meaning of the word "connected" includes not only the case where two elements or portions are directly connected to each other, but also the case where two elements or portions are electrically connected through another element or the like.

First Preferred Embodiment

FIG. 1A is a block diagram of a multiplexer 1 according to a first preferred embodiment of the present invention. FIG. 1A further illustrates an antenna element 2 that is connected to a common terminal Port1 of the multiplexer 1.

The multiplexer 1 is a branching device including three or more filters of which pass bands are different from one another, and of which terminals on the antenna side are commonly connected at the common terminal Port1. Thus, in the multiplexer 1, three or more filters are commonly connected at the common terminal Port1. In this preferred embodiment, as illustrated in FIG. 1A, the multiplexer 1 includes the common terminal Port1, three individual terminals Port2 to Port4, and three filters 11 to 13. The three filters 11 to 13 are provided respectively in three paths 31 to 33 that are commonly connected at a common junction point N, and those three filters have pass bands different from one another. In this preferred embodiment, the multiplexer 1 further includes phase adjustment circuits 21 and 22.

The common terminal Port1 is disposed in common to a plurality of filters (three filters 11 to 13 in this preferred embodiment), and is connected to the plurality of filters at the inside of the multiplexer 1. Furthermore, the common terminal Port1 is connected to the antenna element 2 at the outside of the multiplexer 1. In other words, the common terminal Port1 is a common antenna terminal of the multiplexer 1.

The three individual terminals Port2 to Port4 are disposed respectively corresponding to the filters 11 to 13 in the mentioned order, and are connected to the corresponding filters at the inside of the multiplexer 1. Moreover, the individual terminals Port2 to Port4 are connected to an RF signal processing circuit (RFIC: Radio Frequency Integrated Circuit, not illustrated) through an amplifier circuit and so on (not illustrated) at the outside of the multiplexer 1.

The filter 11 is located in the path 31 connecting the common terminal Port1 and the individual terminal Port2 to each other. In this preferred embodiment, the filter 11 preferably is a filter having a pass band given as Band 3 of LTE (Long Term Evolution), for example. More specifically, the filter 11 is a reception filter having a pass band given as the down frequency band (reception band) in Band 3.

The filter 12 is located in the path 32 connecting the common terminal Port1 and the individual terminal Port3 to each other. In this preferred embodiment, the filter 12 preferably is a filter having a pass band given as Band 1 of the LTE, for example. More specifically, the filter 12 preferably is a reception filter having a pass band given as the down frequency band (reception band) in Band 1, for example.

The filter 13 is located in the path 33 connecting the common terminal Port1 and the individual terminal Port4 to each other. In this preferred embodiment, the filter 13 preferably is a filter having a pass band given as Band 7 of the LTE, for example. More specifically, the filter 13 preferably is a reception filter having a pass band given as the down frequency band (reception band) in Band 7, for example.

Thus, the multiplexer 1 according to this preferred embodiment preferably is a triplexer including the filter 12, which has a pass band given as a Band1RX band and which is one example of a first filter having a pass band given as a first frequency band, the filter 13, which has a pass band given as a Band7RX band and which is one example of a second filter having a pass band given as a second frequency band, and the filter 11, which has a pass band given as a Band3RX band and which is one example of a third filter having a pass band given as a third frequency band.

In this preferred embodiment, the filters 11 to 13 are each an acoustic wave filter including an acoustic wave resonator, specifically a surface acoustic wave resonator utilizing a surface acoustic wave (SAW). The pass band of each of the filters 11 to 13 is different from a frequency range sandwiched between a resonant frequency and an antiresonant frequency of the acoustic wave resonator of each of the other filters. For instance, the pass band of the filter 11 is different from the frequency range sandwiched between the resonant frequency and the antiresonant frequency of the acoustic wave resonator of the filter 12, and from the frequency range sandwiched between the resonant frequency and the antiresonant frequency of the acoustic wave resonator of the filter 13. A detailed structure of the acoustic wave resonator will be described later.

The acoustic wave resonator is not limited to the surface acoustic wave resonator, and it may be an acoustic wave resonator utilizing a boundary acoustic wave or a bulk acoustic wave (BAW), for example. Furthermore, each of the filters 11 to 13 is not limited to an acoustic wave filter, and it may be an LC resonant filter or a dielectric filter. In other words, the configuration of each of the filters 11 to 13 may be selected as appropriate depending on, for example, restrictions in mounting layout or demanded filter characteristics.

Frequency bands assigned as respective pass bands of the filters 11 to 13 are described here. In the following description, regarding a frequency range of each band, a numerical value range representing a range of not less than A and not more than B is expressed by A to B in a simplified manner.

Figure 1B:
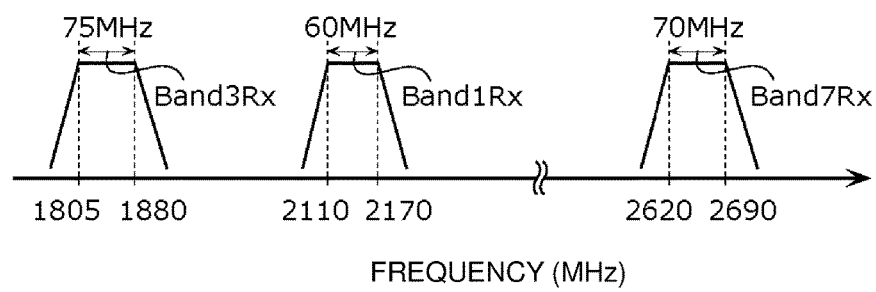
FIG. 1B is a chart referenced to explain pass bands of the multiplexer according to the first preferred embodiment of the present invention.

FIG. 1B is a chart referenced to explain the pass bands of the multiplexer 1 according to this preferred embodiment. More specifically, FIG. 1B is a chart referenced to explain the frequency bands assigned respectively to the reception bands of Band 3, 1 and 7. Hereinafter, "Band of the LTE" is simply expressed as "Band", and the reception band (Rx) in each Band, for example, the reception band (Rx) in Band 1, is simply expressed by the band name and a suffixed sign indicating a reception band or a transmission band, like "Band1Rx band", in some cases.

As illustrated in FIG. 1B, about 1805 MHz to about 1880 MHz is assigned to the Band3Rx band that preferably is the pass band of the filter 11, for example. Thus, a band width of the pass band of the filter 11 preferably is about 75 MHz, for example. About 2110 MHz to about 2170 MHz preferably is assigned to the Band1Rx band that is the pass band of the filter 12, for example. Thus, a band width of the pass band of the filter 12 preferably is about 60 MHz, for example. About 2620 MHz to about 2690 MHz preferably is assigned to the Band7Rx band that is the pass band of the filter 13, for example. Thus, a band width of the pass band of the filter 13 preferably is about 70 MHz, for example.

Accordingly, each of the filters 11 to 13 has filter characteristics allowing a signal in the corresponding pass band to pass therethrough and attenuating signals in the other bands, as represented by solid lines in FIG. 1B.

As described above, the filters 11 to 13 have different pass bands from one another. Furthermore, in this preferred embodiment, those pass bands are apart from each other in excess of the pass band widths of those filters. In other words, a band width of each vacant band between two adjacent pass bands is in excess of the pass band widths. It is to be noted that the pass bands of the filters 11 to 13 are just required to be different from one another, and that the adjacent two of those pass bands may be apart from each other at an interval smaller than the pass band widths.

The n number of filters described above (for example, three filters 11 to 13 in this preferred embodiment) satisfy the following impedance relationship when focusing on one arbitrary filter and the (n−1) number of filters (two filters in this preferred embodiment), which are commonly connected to the one filter.

More specifically, impedances of the (n−1) number of the counterpart-side filters in the pass band of the one filter are in a complex conjugate relationship when viewing the side including the filters 11 to 13 from the common junction point N in a state before common connection where the paths 31 to 33 are not commonly connected. Although details of the complex conjugate relationship will be described in connection with later-described characteristics of the multiplexer 1, the complex conjugate relationship is satisfied in this preferred embodiment with the provision of the phase adjustment circuits 21 and 22.

Configurations of the phase adjustment circuits 21 and 22 will be described below.

At least one phase adjustment circuit is disposed between the common junction point N and at least one among the n number of filters (in this preferred embodiment, the phase adjustment circuits 21 and 22 are disposed respectively between the common junction point N and the filters 11 and 12 among the three filters 11 to 13). The phase adjustment circuit adjusts a phase of the at least one filter such that the above-described complex conjugate relationship is satisfied when viewing the side including the n number of filters from the common junction point N in a state before the common connection where the n number of paths (for example, three paths 31 to 33 in this preferred embodiment) are not commonly connected.

In this preferred embodiment, each of the phase adjustment circuits 21 and 22 preferably is an LC matching circuit including one or more inductors and one or more capacitors. More specifically, the phase adjustment circuit includes a capacitor that is connected in series in at least one path in which the at least one filter is disposed (in this preferred embodiment, in each of the paths 31 and 32 in which the filters 11 and 12 are disposed respectively), and by an inductor that is connected in series in a path interconnecting the at least one path and the ground.

The phase adjustment circuits 21 and 22 have the same configuration except that the corresponding filters are different and hence respective constants of those filters are different. Accordingly, in the following description, a capacitor C211 and inductors L211 and L212 of the phase adjustment circuit 21 are described, while description of a capacitor C221 and inductors L221 and L222 of the phase adjustment circuit 22 is omitted.

The capacitor C211 is connected in series in the path 31 between the common junction point N and the filter 11. The inductor L211 is connected in series in a path interconnecting one end of the capacitor C211 and the ground. The inductor L212 is connected in series in a path interconnecting the other end of the capacitor C211 and the ground.

Constants of the above-mentioned elements (i.e., the capacitor C211 and the inductors L211 and L212) are appropriately set such that impedance matching is established in the band of the filter 11 when viewing the filter 11 side from the common junction point N before the common connection. Furthermore, those constants are appropriately set such that impedances in the (n−1) number of pass bands of the counterpart-side filters (the pass bands of the filters 12 and 13 here) are in a complex conjugate relationship when viewing the filter 11 side from the common junction point N in the state before the common connection.

For example, the so-called CA (carrier aggregation) technique of simultaneously transmitting and receiving radio frequency signals in a plurality of frequency bands (e.g., the Band1Rx band, the Band3Rx band, and the Band7Rx band in this preferred embodiment) is applied to the above-described multiplexer 1, and the filters 11 to 13 perform filtering of the radio frequency signals at the same time.

Structures of the acoustic wave resonators of the filters 11 to 13 will be described below in connection with, for example, the resonator of the filter 11.

FIGS. 2A and 2B schematically illustrate, by way of example, a resonator 111 of the filter 11 according to the first preferred embodiment; specifically, FIG. 2A represents a plan view and FIG. 2B represents a sectional view. In other words, FIGS. 2A and 2B illustrate a schematic plan view and a schematic sectional view, which represent the structure of the resonator 111. It is to be noted that the resonator 111 illustrated in FIGS. 2A and 2B is to explain a typical structure of the above-mentioned plural resonators, and that the number, the length, etc. of electrode fingers of each of electrodes are not limited to the illustrated ones.

The resonator of the filter 11 includes a piezoelectric substrate 356, and interdigital transducer (IDT) electrodes 52a and 52b each having a comb shape.

As illustrated in the plan view of FIG. 2A, the pair of IDT electrodes 52a and 52b opposing to each other are provided on the piezoelectric substrate 356. The IDT electrode 52a includes a plurality of electrode fingers 552a parallel or substantially parallel to one another, and by a busbar electrode 551a interconnecting the plurality of electrode fingers 552a. The IDT electrode 52b includes a plurality of electrode fingers 552b parallel or substantially parallel to one another, and by a busbar electrode 551b interconnecting the plurality of electrode fingers 552b. The plurality of electrode fingers 552a and 552b extend in a direction orthogonal to the propagation direction of an acoustic wave.

As illustrated in the sectional view of FIG. 2B, each IDT electrode 52 including the plurality of electrode fingers 552a or 552b and the busbar electrode 551a or 551b has a multilayer structure including an adhesion layer 353 and a main electrode layer 354.

The adhesion layer 353 increases adhesion between the piezoelectric substrate 356 and the main electrode layer 354, and Ti is used as an example of materials of the adhesion layer 353. The adhesion layer 353 preferably has a film thickness of about 12 nm, for example.

Al containing about 1% of Cu is used as an example of materials of the main electrode layer 354. The main electrode layer 354 preferably has a film thickness of about 162 nm, for example.

A protective layer 355 is formed in a state covering the IDT electrode 52. The protective layer 355 protects the main electrode layer 354 from external environments, to adjust frequency-temperature characteristics, and to increase moisture resistance. The protective layer 355 is a film containing, for example, silicon dioxide as a main ingredient.

Materials of the adhesion layer 353, the main electrode layer 354, and the protective layer 355 are not limited to the above-mentioned materials. Furthermore, the IDT electrode 52 is not always required to have the above-described multilayer structure. The IDT electrode 52 may be made of, for example, a metal or an alloy, such as Ti, Al, Cu, Pt, Au, Ag, Pd, W, Mo, or NiCr. Alternatively, the IDT electrode 52 may include a plurality of multilayer bodies each made of the above-mentioned metal or alloy. The protective layer 355 may be omitted as desired.

The piezoelectric substrate 356 is made of, for example, a $LiTaO_3$ piezoelectric single crystal, a $LiNbO_3$ piezoelectric single crystal, or a piezoelectric ceramic.

The structure of the resonator of the filter 11 is not limited to the structure illustrated in FIG. 2. For instance, the IDT electrode 52 may be a single layer of a metal film instead of having the multilayer structure of metal films.

Characteristics of the multiplexer 1 according to this preferred embodiment will be described below.

Figure 3:
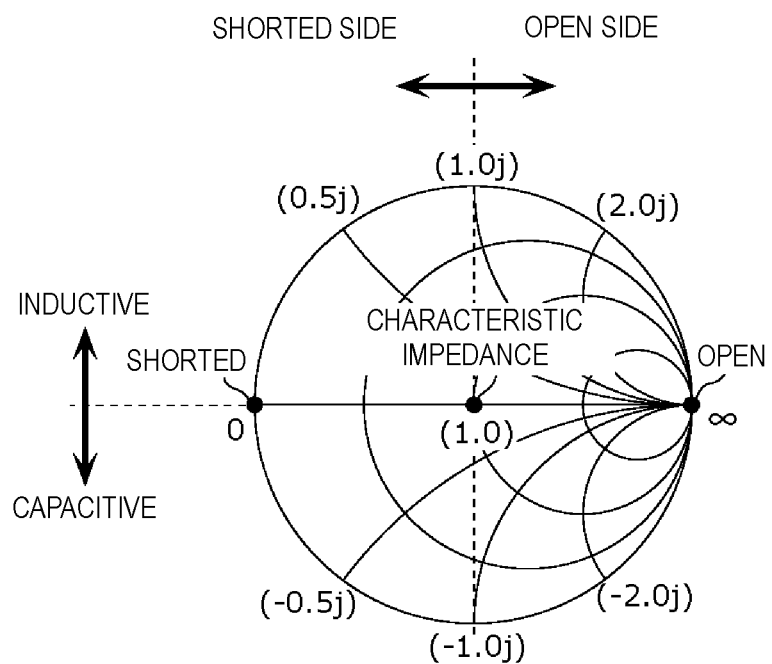
FIG. 3 is a chart referenced to explain a definition regarding a the so-called Smith chart.

First, a definition regarding the so-called Smith chart referenced in the following description of impedance is explained. FIG. 3 is a chart referenced to explain the definition regarding the Smith chart. Numerals in parentheses in FIG. 3 represent values in the Smith chart after being normalized on the basis of a characteristic impedance (e.g., about 50Ω).

As illustrated in FIG. 3, in the Smith chart, a left end at which a normalized impedance is 0+0j represents a shorted state (denoted by SHORTED), a central zone where the normalized impedance is substantially 1+0j represents an impedance matching state, and a right end at which at least one of a real component and an imaginary component of the normalized impedance is infinite (∞) represents an open state (denoted by OPEN). In the following, therefore, a region on the right side of the center of the Smith chart where an impedance is higher than the characteristic impedance, namely a region on the right side of a linear line interconnecting the normalized impedances 0+1j, 1+0j and 0−1j in the normalized Smith chart, is defined as an open side. Moreover, a region on the left side of the center of the Smith chart where an impedance is lower than the characteristic impedance, namely a region on the left side of the above-mentioned linear line in the normalized Smith chart, is defined as a shorted side.

Furthermore, as illustrated in FIG. 3, in the Smith chart, a region on the upper side of a real axis, which is given by a linear line interconnecting SHORTED and OPEN, is a region where the imaginary component (reactance or susceptance) is positive, and represents a state providing an inductive reactance or an inductive susceptance. On the other hand, a region on the lower side of the real axis is a region where the imaginary component is negative, and represents a state providing a capacitive reactance or a capacitive susceptance. In the following, therefore, the region on the upper side of the real axis of the Smith chart is defined as an inductive region (side), and the region on the lower side of the real axis is defined as a capacitive region (side).

Figure 4:
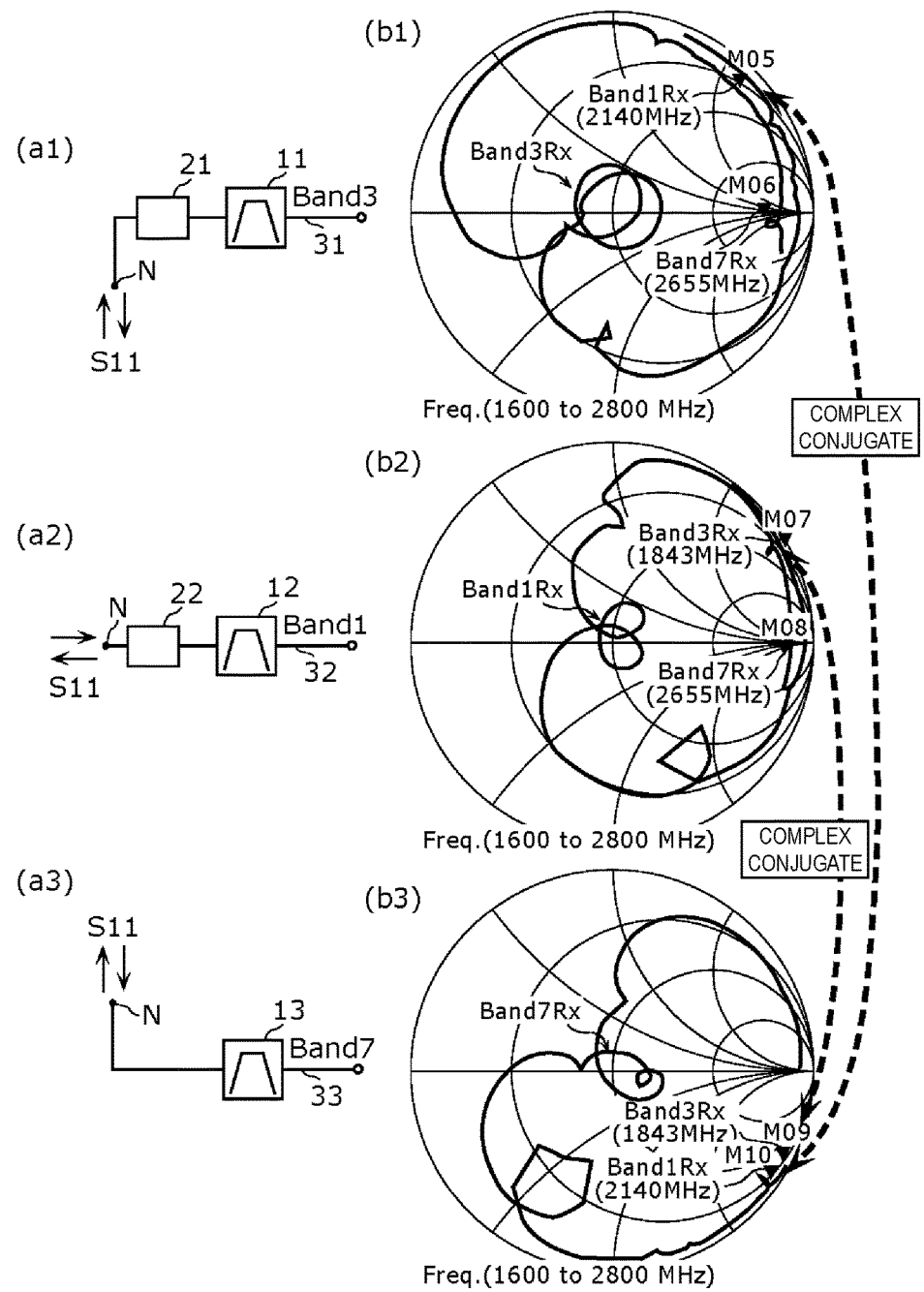
FIG. 4 illustrates Smith charts representing reflection characteristics when viewing the filter side from a common junction point before common connection in the first preferred embodiment of the present invention.

FIG. 4 illustrates Smith charts representing reflection characteristics (impedances) when viewing the side including the filters 11 to 13 from the common junction point N before the common connection in this preferred embodiment. In other words, those reflection characteristics represent respective reflection characteristics of the individual filters 11 to 13 in a separated state when viewed from the common junction point N. In FIG. 4, (a1) to (a3) schematically illustrate states where the reflection characteristics illustrated in (b1) to (b3) of FIG. 4 are measured, respectively. In this preferred embodiment, the characteristic impedance of a transfer line at the common junction point N preferably is about 50Ω, and the center of the Smith chart also indicates about 50Ω, for example. The above explanation is similarly applied to Smith charts described hereinafter. It is to be noted that the characteristic impedance is not always limited to about 50Ω.

As seen from FIG. 4, in all the filters 11 to 13, the impedances of the individual filters in the separated state when viewed from the common junction point N are positioned in the central zones of the Smith charts in the corresponding bands. Thus, all the individual filters 11 to 13 in the separated state establish the impedance matching in their own pass bands.

On the other hand, in all the filters 11 to 13, the impedances of the individual filters in the separated state when viewed from the common junction point N are positioned away from the central zones of the Smith charts in the pass bands of the counterpart-side filters, specifically positioned closer to the open side.

In more detail, the impedance of the filter 11 having the Band3Rx band as its own pass band is positioned closer to the open side and away from the real axis in the inductive region in the Band1Rx band that is one of the pass bands of the counterpart-side filters, and it is positioned substantially at OPEN in the Band7Rx band that is the other of the pass bands of the counterpart-side filters. Here, the word "substantially" includes not only the case of exact agreement, but also the case of almost agreement.

The impedance of the filter 12 having the Band1Rx band as its own pass band is positioned closer to the open side and away from the real axis in the inductive region in the Band3Rx band that is one of the pass bands of the counterpart-side filters, and is positioned substantially at OPEN in the Band7Rx band that is the other of the pass bands of the counterpart-side filters.

The impedance of the filter 13 having the Band7Rx band as its own pass band is positioned closer to the open side and away from the real axis in the capacitive region in each of the Band3Rx band and the Band1Rx band, which are the pass bands of the counterpart-side filters.

Here, the filter 12 as one example of the first filter and the filter 13 as one example of the second filter have impedances of which imaginary components cancel each other in the Band3Rx band as one example of the third frequency band when viewed from the common junction point N in the state where the paths 31 to 33 are not commonly connected. More specifically, focusing on the Band3Rx band that is the pass band of the filter 11, it is understood that the impedances of the filters 12 and 13, i.e., the filters commonly connected with the filter 11, are in the complex conjugate relationship. In other words, the impedances of the filters 12 and 13 among the filters 11 to 13 except for the filter 11 are in the complex conjugate relationship in the pass band (Band3Rx band) of the filter 11 when viewing the side including the filters 11 to 13 from the common junction point N in the state not under the common connection.

The filter 13 as one example of the second filter and the filter 11 as one example of the third filter have impedances of which imaginary components cancel each other in the Band1Rx band as one example of the first frequency band when viewed from the common junction point N in the state where the paths 31 to 33 are not commonly connected. More specifically, focusing on the Band1Rx band that is the pass band of the filter 12, it is understood that the impedances of the filters 11 and 13, i.e., the filters commonly-connected with the filter 12, are in the complex conjugate relationship. In other words, the impedances of the filters 11 and 13 among the filters 11 to 13 except for the filter 12 are in the complex conjugate relationship in the pass band (Band1Rx band) of the filter 12 when viewing the side including the filters 11 to 13 as described above.

Focusing on the Band7Rx that is the pass band of the filter 13, it is understood that the impedances of the filters 11 and 12, i.e., the filters commonly-connected with the filter 13, are infinite (have absolute values of not less than about 500Ω). In other words, the impedances of the filters 11 and 12 among the filters 11 to 13 except for the filter 13 are infinite (have absolute values of not less than about 500Ω) in the pass band (Band7Rx band) of the filter 13 when viewing the side including the filters 11 to 13 as described above. Thus, when viewing the filters 11 and 12 as described above, those filters 11 and 12 are in the open state in the pass band of the filter 13.

Here, the expression "in the complex conjugate relationship" implies that one impedance is inductive and the other impedance is capacitive. More specifically, assuming that one impedance is denoted by $R_1+jX_1$ and the other impedance is denoted by $R_2+jX_2$, the expression "in the complex conjugate relationship" implies that $X_1>0$ and $X_2<0$ are satisfied, more restrictively that $X_1=-X_2$ is satisfied. The expression "$X_1=-X_2$ is satisfied" includes not only the case where $X_1=-X_2$ is exactly satisfied, but also the case where $X_1=-X_2$ is substantially satisfied. Thus, a certain amount of error is allowed. The certain amount of error is, for example, several ten percentages and more preferably several percentages.

The above-described relationship between $X_1$ and $X_2$ is applied to not only the case where the relationship is satisfied for actually measured values including measurement errors, etc., but also the case where the relationship is satisfied for design values.

The expression "the impedance is infinite" ideally implies that the impedance is infinite, and practically implies in this embodiment that an absolute value of the impedance is not less than about 500Ω, for example. In other words, if an absolute value of the impedance is not less than about 500Ω when viewing the other filter from the common junction point in a frequency band corresponding to the pass band of one filter, an influence of the other filter is ignorable in characteristics of the multiplexer 1 in the frequency band of the one filter. Accordingly, when the absolute value of the impedance is not less than about 500Ω, equivalent characteristics to those obtained in the case of the impedance being infinite are able to be obtained as the characteristics of the multiplexer 1.

By commonly connecting, at the common junction point N, the individual filters 11 to 13 each having the above-described reflection characteristics in the separated state, the reflection characteristics after the common connection when viewed from the common junction point N are given as follows.

Figure 5:
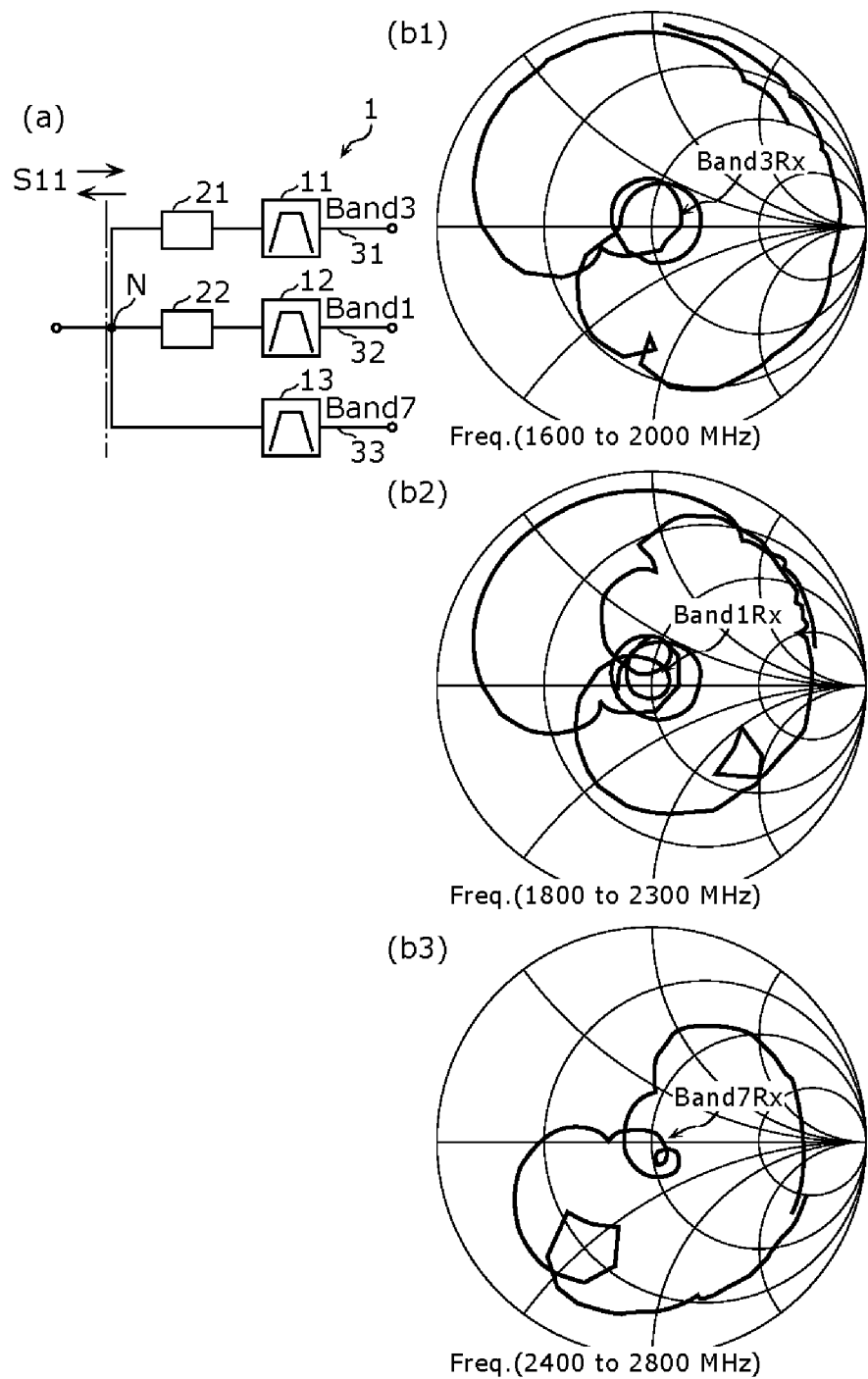
FIG. 5 illustrates Smith charts representing reflection characteristics when viewing the filter side from the common junction point after the common connection in the first preferred embodiment of the present invention.

FIG. 5 illustrates Smith charts representing reflection characteristics (impedances) when viewing the side including the filters 11 to 13 from the common junction point N after the common connection in this preferred embodiment. In other words, those reflection characteristics represent respective reflection characteristics of the filters 11 to 13 after the common connection when viewed from the common junction point N. In FIG. 5, (a) schematically illustrates a state where the reflection characteristics illustrated in (b1) to (b3) of FIG. 5 are measured.

As seen from FIG. 5, the impedances of the filters 11 to 13 when viewed from the common junction point N after the common connection are positioned in the central zones of the Smith charts in all the pass bands of the filters 11 to 13 (e.g., in the Band3Rx band, the Band1Rx band, and the Band7Rx band in this embodiment). Thus, it is understood that, in the filters 11 to 13 after the common connection, the impedance matching is established in the respective pass bands of those filters. The reason is as follows.

Regarding each of the filters 11 and 12, the impedances of the individual counterpart-side filters in the separated state when viewed from the common junction point N are in the complex conjugate relationship in the pass band of the filter 11 or 12. Focusing on the filter 11, for example, the impedances of the individual counterpart-side filters (e.g., the filters 12 and 13) in the separated state when viewed from the common junction point N are in the complex conjugate relationship in the pass band (Band 3) of the filter 11. Thus, in this case, the filters 12 and 13 have, as their impedances in Band 3, impedances having imaginary components of which absolute values are equal or substantially equal to each other and which are reversed in positive and negative signs. Accordingly, when the filters 12 and 13 are commonly connected to each other, the imaginary components are cancelled and the combined impedance of the counterpart-side filters in the pass band of the filter 11 when viewed from the common junction point N has substantially no imaginary component. Hence the filters 11 to 13 after the common connection are each less affected in the pass band of the filter 11 by the combined impedance of the counterpart-side filters with respect to the filter 11. As a result, the impedances in the pass band of the filter 11 are mainly restricted by the impedance of the filter 11 alone. Since the impedance matching is established for the filter 11 alone in its own pass band as described above, the impedance matching is able to be established for the filters 11 to 13 after the common connection in the pass band of the filter 11. The above point is similarly applied to the case of focusing on the filter 12.

Regarding the filter 13, the impedances of the individual counterpart-side filters (e.g., the filters 11 and 12) in the separated state when viewed from the common junction point N are infinite (have absolute values of not less than about 500Ω) in the pass band (Band 7) of the filter 13. Accordingly, the filters 11 to 13 after the common connection are less affected in the pass band of the filter 13 by the combined impedance of the counterpart-side filters with respect to the filter 13. As a result, the impedances in the pass band of the filter 13 are mainly restricted by the impedance of the filter 13 alone. Since the impedance matching is established for the filter 13 alone in its own pass band as described above, the impedance matching is able to be established for the filters 11 to 13 after the common connection in the pass band of the filter 13.

Figure 6:
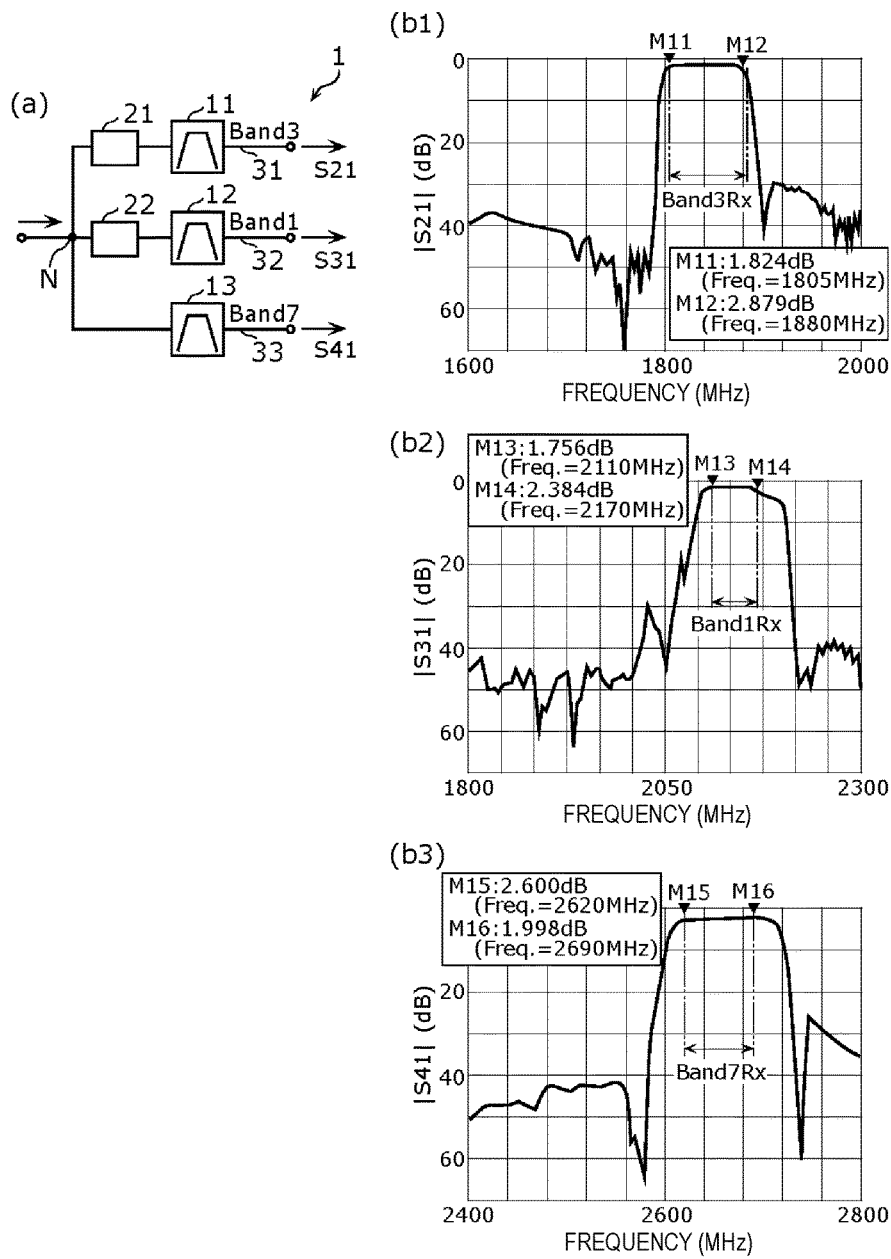
FIG. 6 illustrates filter characteristics after the common connection in the first preferred embodiment of the present invention.

FIG. 6 illustrates filter characteristics (bandpass characteristics) after the common connection in this preferred embodiment. In FIG. 6, (a) schematically illustrates a state where the bandpass characteristics illustrated in (b1) to (b3) of FIG. 6 are measured. More specifically, (b1) of FIG. 6 represents bandpass characteristics of the path 31 via the filter 11. In more detail, (b1) of FIG. 6 represents an insertion loss that is given as an absolute value of an intensity ratio (S21) of a signal output from the individual terminal Port2 to a signal input to the common terminal Port1. Furthermore, (b2) of FIG. 6 represents bandpass characteristics of the path 32 via the filter 12. In more detail, (b2) of FIG. 6 represents an insertion loss that is given as an absolute value of an intensity ratio (S31) of a signal output from the individual terminal Port3 to the signal input to the common terminal Port1. Moreover, (b3) of FIG. 6 represents bandpass characteristics of the path 33 via the filter 13. In more detail, (b3) of FIG. 6 represents an insertion loss that is given as an absolute value of an intensity ratio (S41) of a signal output from the individual terminal Port4 to the signal input to the common terminal Port1. The above points are similarly applied to later-described charts representing filter characteristics.

As seen from FIG. 6, in the filter characteristics of the multiplexer 1 according to this preferred embodiment, low losses are realized in all the pass bands of the filters 11 to 13 (e.g., in the Band3Rx band, the Band1Rx band, and the Band7Rx band in this embodiment). In other words, the advantageous effects of providing satisfactory electrical characteristics are able to be obtained with the multiplexer 1 according to this preferred embodiment.

The advantageous effects of the multiplexer 1 according to this preferred embodiment will be described below in comparison with a comparative example.

Figure 7:
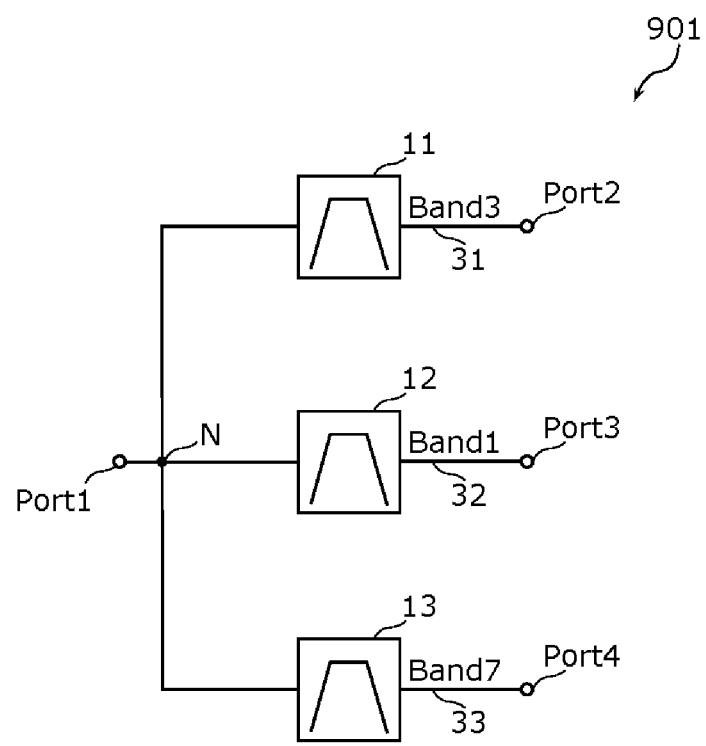
FIG. 7 is a block diagram of a multiplexer according to a comparative example.

First, a multiplexer 901 according to the comparative example is described. FIG. 7 is a block diagram of the multiplexer 901 according to the comparative example.

The multiplexer 901 illustrated in FIG. 7 is different from the multiplexer 1 according to the first preferred embodiment in that the phase adjustment circuits 21 and 22 are not disposed and hence the above-described complex conjugate relationship is not satisfied.

Figure 8:
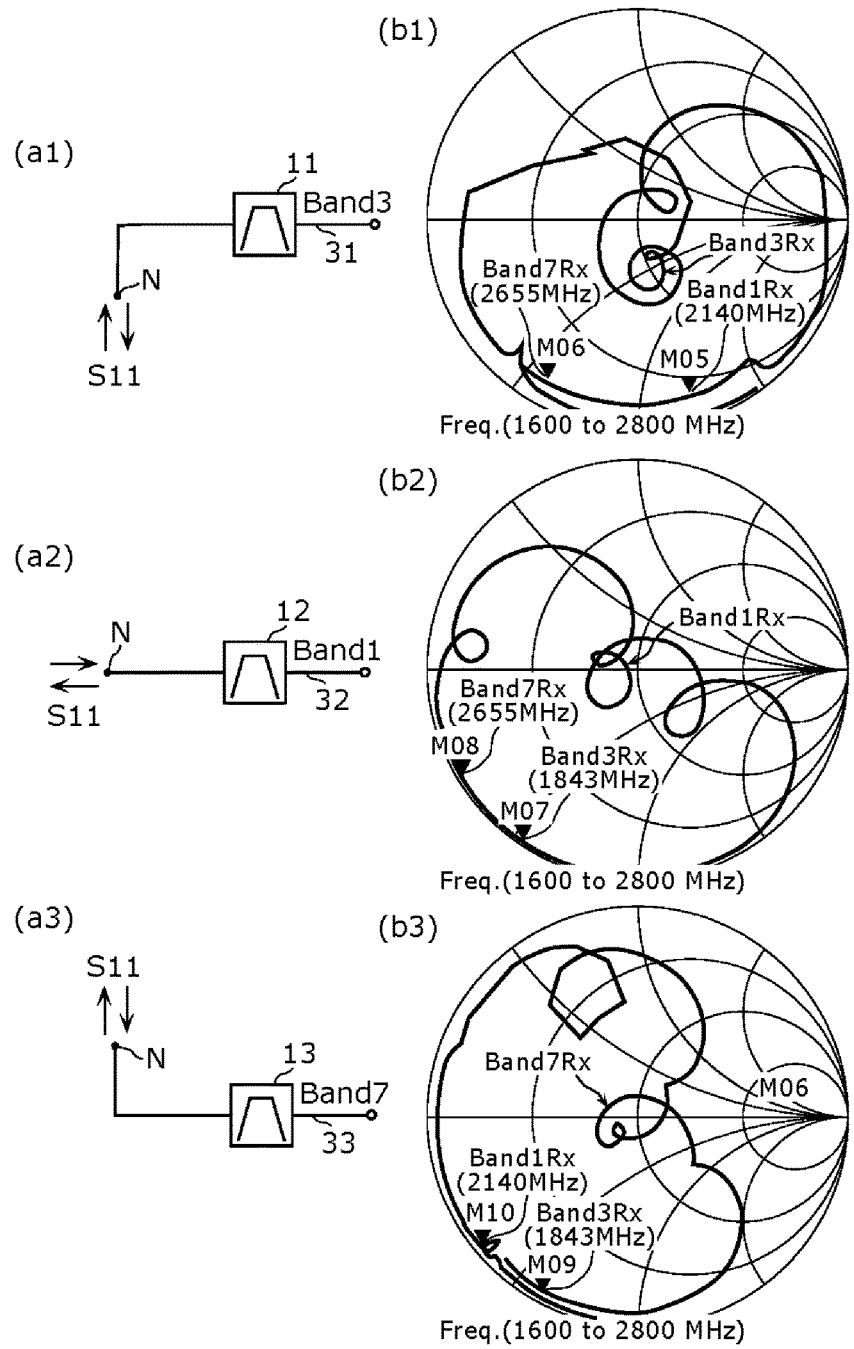
FIG. 8 illustrates Smith charts representing reflection characteristics when viewing the filter side from the common junction point before the common connection in the comparative example.

FIG. 8 illustrates Smith charts representing reflection characteristics (impedances) when viewing the side including the filters 11 to 13 from the common junction point N before the common connection in the comparative example. In FIG. 8, (a1) to (a3) schematically illustrates states where the reflection characteristics illustrated in (b1) to (b3) of FIG. 8 are measured, respectively.

As seen from FIG. 8, also in the comparative example, because the impedances of the individual filters 11 to 13 are positioned in the central zones of the Smith charts in their own pass bands, the impedance matching is established as in the first preferred embodiment. Regarding each of the filters 11 to 13, however, the impedances in the pass bands of the counterpart-side filters are positioned away from the central zones of the Smith charts. Moreover, in the comparative example, the above-described complex conjugate relationship is not satisfied and the impedances are positioned closer to the shorted side in a rough sense unlike the first preferred embodiment.

The multiplexer 901 according to the comparative example in which the filters 11 to 13 having the above-described characteristics are commonly connected at the common junction point N has characteristics described below.

Figure 9:
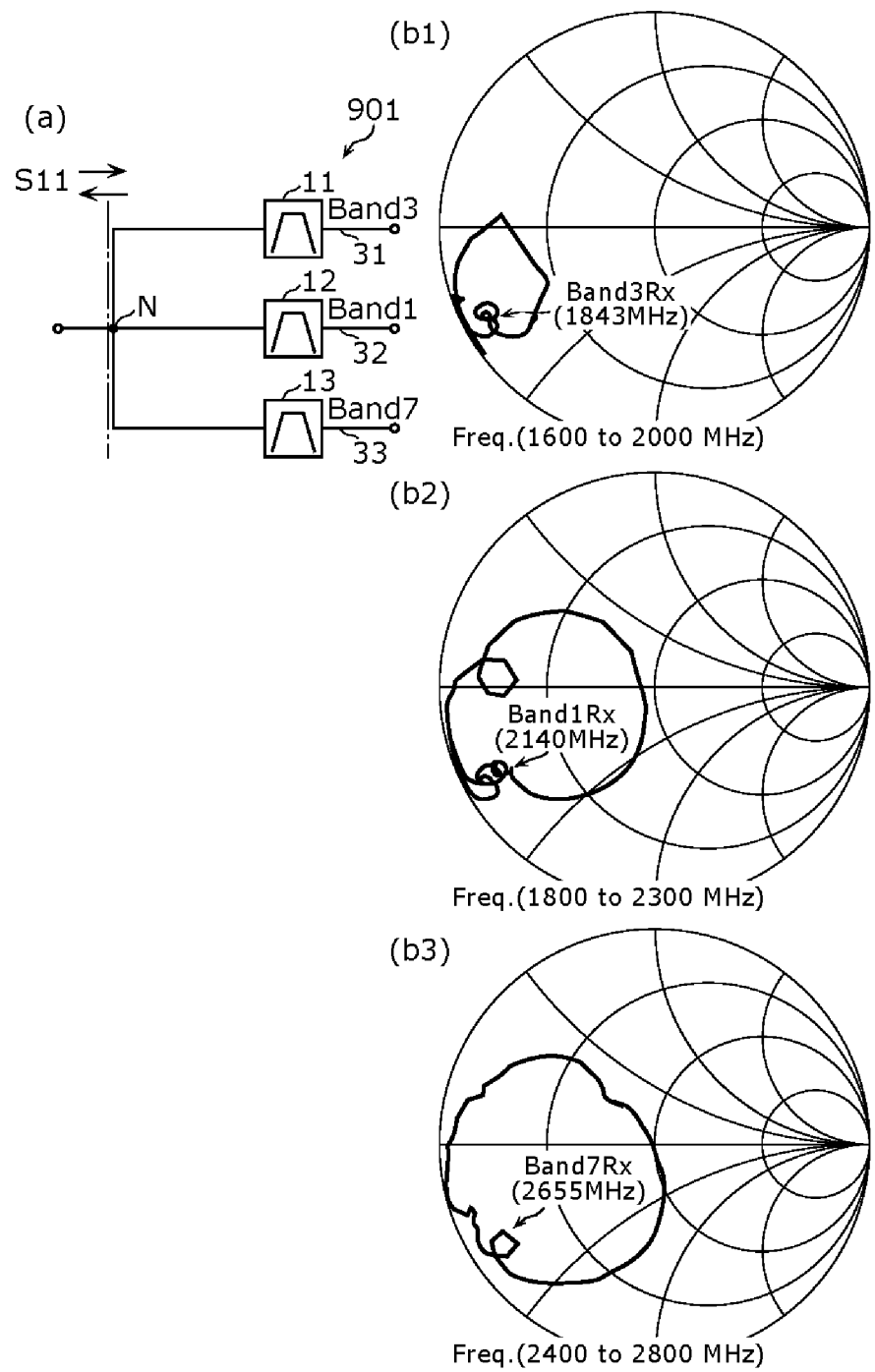
FIG. 9 illustrates Smith charts representing reflection characteristics when viewing the filter side from the common junction point after the common connection in the comparative example.

FIG. 9 illustrates Smith charts representing reflection characteristics (impedances) when viewing the side including the filters 11 to 13 from the common junction point N after the common connection in the comparative example. In FIG. 9, (a) schematically illustrates a state where the reflection characteristics illustrated in (b1) to (b3) of FIG. 9 are measured.

As seen from FIG. 9, in the multiplexer 901, the impedances are positioned away from the central zones of the Smith charts in all the pass bands of the filters 11 to 13, specifically positioned closer to the shorted side. Thus, in the multiplexer 901 according to the comparative example, impedance mismatching occurs in all of the Band3Rx band, the Band1Rx band, and the Band7Rx band.

Figure 10:
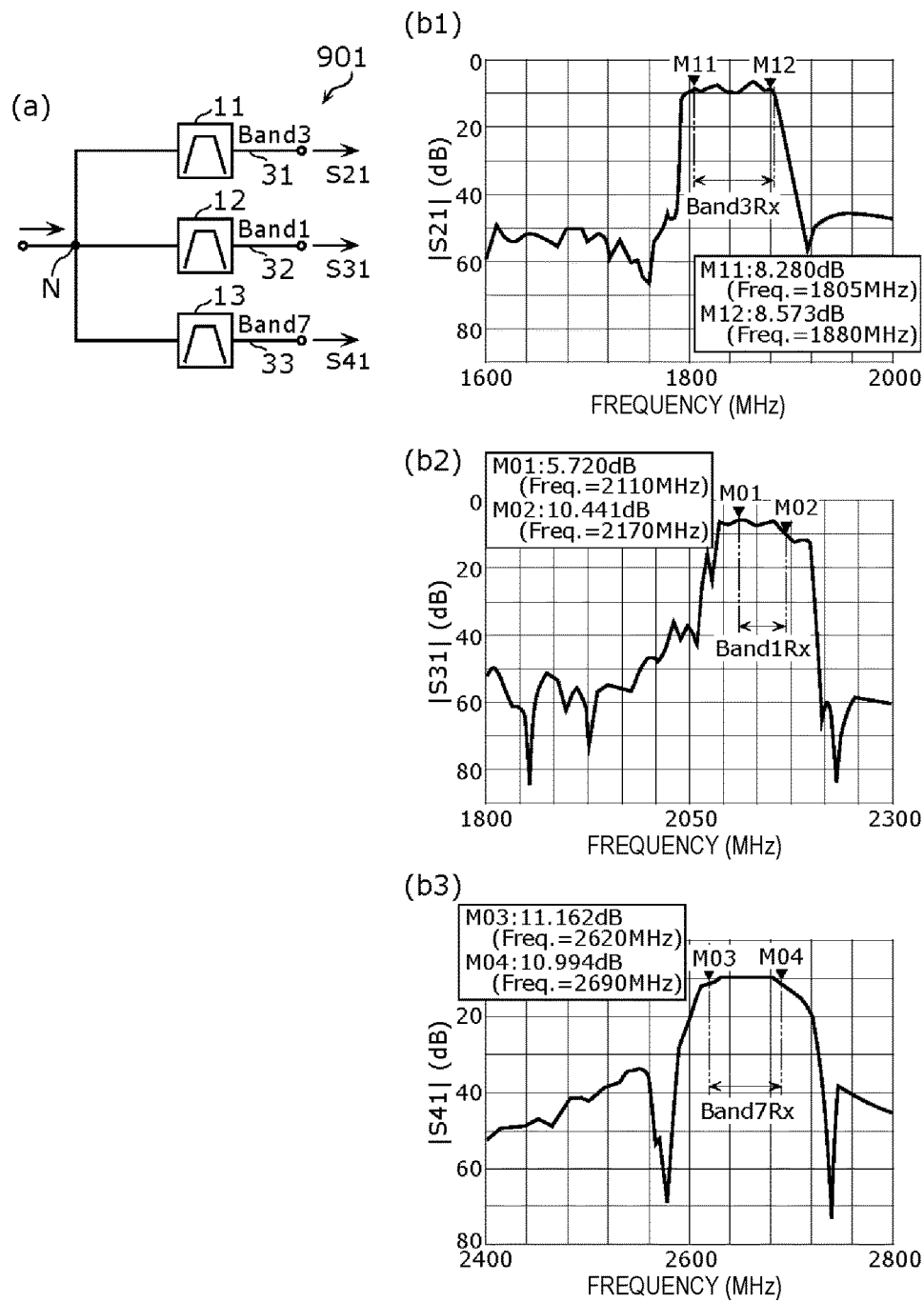
FIG. 10 illustrates filter characteristics after the common connection in the comparative example.

FIG. 10 illustrates filter characteristics (bandpass characteristics) after the common connection in the multiplexer 901 according to the comparative example.

As seen from comparison between FIG. 6 and FIG. 10, the multiplexer 1 according to the first preferred embodiment generates smaller insertion losses in the pass bands and hence exhibits more satisfactory electrical characteristics than the multiplexer 901 according to the comparative example. More specifically, in the first preferred embodiment, the insertion losses are reduced in all the plurality of pass bands (e.g., the Band3Rx band, the Band1Rx band, and the Band7Rx band in this preferred embodiment) in comparison with the comparative example.

Stated in another way, in the comparative example, the combined impedance of the counterpart-side filters in the pass band of each filter when viewed from the common junction point N is given as a low impedance. Accordingly, each of the filters 11 to 13 after the common connection is affected by the impedances of the counterpart-side filters in the pass band of the relevant filter. In the comparative example, therefore, losses are increased in the filter characteristics of each filter.

In contrast, in the multiplexer 1 according to this preferred embodiment, since the impedances of the (n−1) number of filters (corresponding to the two filters 11 and 13 in this preferred embodiment) except for the first filter (corresponding to the filter 12 in this preferred embodiment) are in the complex conjugate relationship in the pass band of the first filter, the (n−1) number of filters have, as their impedances in the pass band of the first filter (the Band1Rx band in this preferred embodiment), impedances having imaginary components of which absolute values are equal or substantially equal to each other and which are reversed in positive and negative signs. Accordingly, when the (n−1) number of filters are commonly connected to each other, the imaginary components are cancelled and the combined impedance of the counterpart-side filters in the pass band of the first filter when viewed from the common junction point N has substantially no imaginary component. Thus, the n number of filters after the common connection are each less affected in the pass band of the first filter by the imaginary component of the combined impedance of the (n−1) number of filters (i.e., the counterpart-side filters with respect to the first filter). Thus, the n number of filters after the common connection realize low losses in the filter characteristics of the first filter. As a result, the multiplexer 1 according to this preferred embodiment provides satisfactory electrical characteristics (i.e., effectively suppresses the losses).

Thus, the (n−1) number of filters have the impedances having the imaginary components that cancel each other at a pass band frequency of the first filter when viewed from the common junction point N. Therefore, the combined impedance when viewing the (n−1) number of filters from the common junction point N is harder to have an imaginary component at the pass band frequency of the first filter (i.e., in the pass band of the first filter). Thus, the combined impedance when viewing the n number of filters from the common junction point N is less affected in the pass band of the first filter by the impedances of the (n−1) number of filters. As a result, the multiplexer 1 according to this preferred embodiment provides satisfactory electrical characteristics.

Stated in another way, according to this preferred embodiment, the impedances of at least two filters (corresponding to the two filters 11 and 13 in this preferred embodiment) among the n number of filters except for the first filter are in the complex conjugate relationship at the pass band frequency of the first filter when viewing the side including the at least two filters from the common junction point N in the state where the at least two corresponding paths are not commonly connected to each other. Thus, satisfactory electrical characteristics are able to be obtained as described above.

Thus, the above-mentioned at least two filters have the impedances of which imaginary components cancel each other at the pass band frequency of the first filter when viewed from the common junction point N in the state where those two filters are not commonly connected. Therefore, the combined impedance when viewing the above-mentioned at least two filters from the common junction point N is harder to have an imaginary component in the pass band of the first filter. Accordingly, by appropriately adjusting the impedances of the other (counterpart-side) filters, the combined impedance when viewing the n number of filters from the common junction point N is less affected in the pass band of the first filter by the impedances of the counterpart-side filters. Thus, satisfactory electrical characteristics are able to be obtained.

Here, in trying to realize low losses in the filter characteristics of all the n number of filters, regarding the filter (corresponding to the filter 11 in this preferred embodiment) that has the pass band positioned at the lowest frequency level, an inductive component or a capacitive component of the counterpart-side filter having one (corresponding to the pass band of the filter 13 in this preferred embodiment) among the frequency bands of the counterpart-side filters (e.g., between the pass bands of the filters 12 and 13 in this preferred embodiment), the one having the frequency farthest away, is increased. In this preferred embodiment, both the impedance of the filter 11 in the pass band of the counter-part side filter 13 and the impedance of the filter 12 in the pass band of the counter-part side filter 13 become capacitive, and a capacitive component of the combined impedance is further increased. This greatly shifts the impedance of the filter 13 toward the capacitive side, and degrades the characteristics. Such a phenomenon is more significant particularly when frequency intervals among the number n of pass bands are large.

Thus, low losses are able to be realized in the filter characteristics of all the n number of filters on condition that, when the pass bands of the n number of filters are arrayed in the order of frequency, the pass band of the first filter is the pass band other than those positioned at the lowest frequency level and the highest frequency level, and that the above-described complex conjugate relationship is satisfied with respect to the (n−1) number of filters except for the first filter.

Particularly, in this preferred embodiment, the pass bands of the first filter and the other filters are apart from each other in excess of the pass band width of the first filter (e.g., the pass band width of about 60 MHz of the filter 12 in this preferred embodiment).

When the above-mentioned frequency relationship is satisfied, it is generally quite difficult to realize low losses because of high difficulty in reducing the imaginary component of the impedance of each of the (n−1) number of filters that are the counterpart-side filters with respect to the first filter. According to this preferred embodiment, however, by setting conditions to satisfy the above-described complex conjugate relationship, low losses are able to be realized in the filter characteristics of the first filter for which it is quite difficult to reduce the losses.

Furthermore, according to this preferred embodiment, since the impedances of the (n−1) number of filters are in the complex conjugate relationship on the open side, the combined impedance of the counterpart-side filters in the pass band of the first filter when viewed from the common junction point N is able to be given as a high impedance. Accordingly, the n number of filters after the common connection realize low losses in the filter characteristics of the first filter.

Thus, the (n−1) number of filters have the impedances having the imaginary components that cancel each other at the pass band frequency of the first filter on the open side, i.e., in the region on the right side of the center of the Smith chart, when viewed from the common junction point N in the state where the (n−1) number of filters are not commonly connected. Therefore, the combined impedance when viewing the (n−1) number of filters from the common junction point N is given as a high impedance, which is positioned on the right side of the center of the Smith chart, in the pass band of the first filter. Accordingly, leakage of a radio frequency signal in the pass band of the first filter to the (n−1) number of filters is effectively suppressed, such that more satisfactory electrical characteristics are able to be obtained in the path passing the first filter.

Stated in another way, according to this preferred embodiment, the impedances of the above-mentioned at least two filters (corresponding to the two filters 11 and 13 in this embodiment) are in the complex conjugate relationship at the pass band frequency of the first filter on the open side, i.e., in the region on the right side of the center of the Smith chart, when viewing the at least two filters from the common junction point N in the state where those two filters are not commonly connected. Hence low losses are able to be realized in the filter characteristics of the first filter as described above.

Thus, the above-mentioned at least two filters have the impedances of which imaginary components cancel each other at the pass band frequency of the first filter on the open side, i.e., in the region on the right side of the center of the Smith chart, when viewed from the common junction point N in the state where those two filters are not commonly connected. Therefore, the combined impedance when viewing the above-mentioned at least two filters from the common junction point N is given as a high impedance in the pass band of the first filter. Accordingly, leakage of a radio frequency signal in the pass band of the first filter to the above-mentioned at least two filters is effectively suppressed, such that more satisfactory electrical characteristics are able to be obtained in the path passing the first filter.

Moreover, according to this preferred embodiment, the impedances of the (n−1) number of filters (corresponding to the filters 11 and 12 in this preferred embodiment) except for the second filter (corresponding to the filter 13 in this preferred embodiment) are infinite (have absolute values of not less than about 500Ω) in the pass band of the second filter (the Band7Rx band in this preferred embodiment). Accordingly, the combined impedance of the counterpart-side filters in the pass band of the second filter when viewed from the common junction point N can be given as a high impedance in the pass band of the second filter. As a result, the n number of filters after the common connection realize low losses in the filter characteristics of the second filter. Thus, leakage of a radio frequency signal in the pass band of the second filter to the above-mentioned (n−1) number of filters is effectively suppressed, such that more satisfactory electrical characteristics are able to be obtained in the path passing the second filter.

In addition, according to this preferred embodiment, the impedances of the (n−1) number of filters (corresponding to the filters 12 and 13 in this embodiment) except for the third filter (corresponding to the filter 11 in this preferred embodiment) are in the complex conjugate relationship in the pass band of the third filter (the Band3Rx band in this preferred embodiment). Accordingly, the above-mentioned (n−1) number of filters have, as their impedances in the pass band of the third filter, impedances having imaginary components of which absolute values are equal or substantially equal to each other and which are reversed in positive and negative signs. Hence the n number of filters after the common connection realize low losses in the filter characteristics of the third filter as in the filter characteristics of the first filter.

Particularly, in this preferred embodiment, because the n number of filters are provided by three filters, low losses are able to be realized in the filter characteristics of all the first to third filters on condition that the above-described relations are satisfied with respect to the first to third filters.

In other words, the combined impedance when viewing the second filter and the third filter from the common junction point is harder to have an imaginary component in the pass band of the first filter. Accordingly, the combined impedance when viewing the three filters from the common junction point is less affected in the pass band of the first filter by the impedances of the second filter and the third filter. As a result, the triplexer capable of providing satisfactory electrical characteristics is realized.

The combined impedance when viewing the first filter and the second filter from the common junction point is harder to have an imaginary component at the pass band frequency of the third filter (i.e., in the pass band of the third filter). Accordingly, the combined impedance when viewing the three filters from the common junction point is less affected in the pass band of the third filter by the impedances of the first filter and the second filter. Thus, with the multiplexer according to this preferred embodiment, low losses are realized in the path passing the third filter. As a result, the triplexer capable of providing more satisfactory electrical characteristics is realized.

The combined impedance when viewing the first filter and the third filter from the common junction point is given as a high impedance in the pass band of the second filter. Accordingly, leakage of a radio frequency signal in the pass band of the second filter to the first filter and the third filter is effectively suppressed, such that more satisfactory electrical characteristics are able to be obtained in the path passing the second filter. As a result, the triplexer capable of providing more satisfactory electrical characteristics is realized.

According to this preferred embodiment, the above-described complex conjugate relationship is easily realized with the provision of the phase adjustment circuits 21 and 22. Thus, the triplexer capable of providing satisfactory electrical characteristics is realized with this preferred embodiment.

According to this preferred embodiment, each of the phase adjustment circuits 21 and 22 preferably is an LC matching circuit. Therefore, regarding the filters in which the impedance matching is not established in their own pass bands in the state not including the phase adjustment circuits 21 and 22, adjustment is able to be made in such a manner that the impedance matching is established in their own pass bands while the impedances in the pass bands of the counterpart-side filters satisfy the above-described complex conjugate relationship.

First Modification

Figure 11:
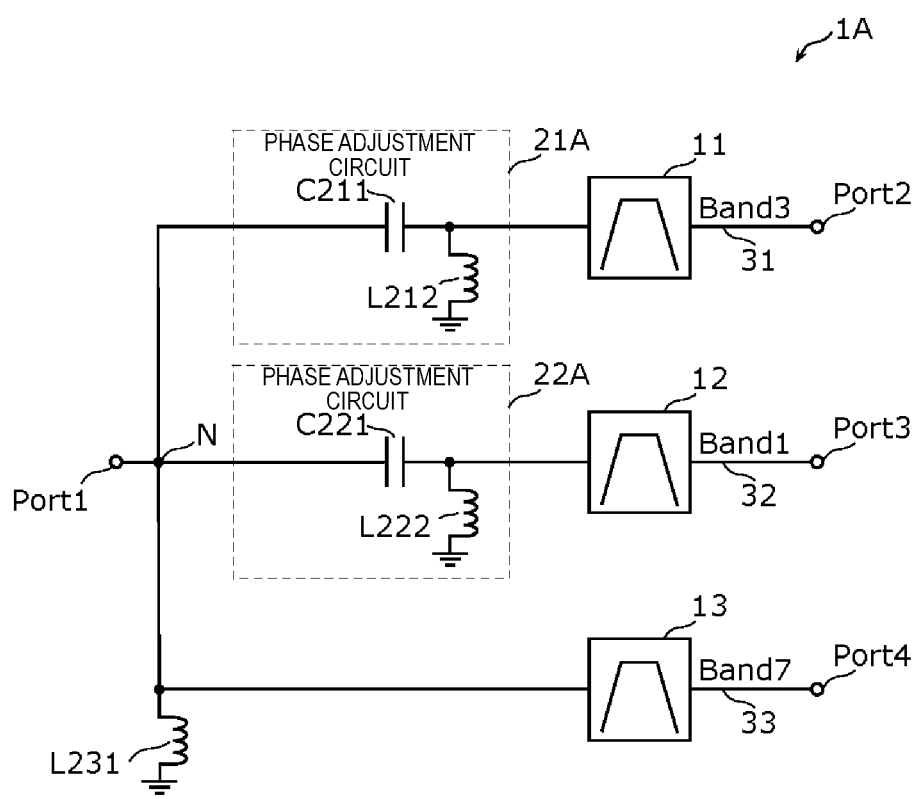
FIG. 11 is a block diagram of a multiplexer according to a first modification of a preferred embodiment of the present invention.

In the multiplexer 1, the phase adjustment circuits 21 and 22 may share common elements with each other. FIG. 11 is a block diagram of a multiplexer 1A having such a configuration according to a first modification of a preferred embodiment of the present invention.

The multiplexer 1A illustrated in FIG. 11 is different from the multiplexer 1 according to the first preferred embodiment in including the phase adjustment circuits 21A and 22A and an inductor L231 instead of the phase adjustment circuits 21 and 22.

The phase adjustment circuit 21A is different from the phase adjustment circuit 21 in the first preferred embodiment in not including the inductor L211 that is an impedance element disposed in the phase adjustment circuit 21 on the side closer to the common junction point N. The phase adjustment circuit 22A is different from the phase adjustment circuit 22 in the first preferred embodiment in not including the inductor L221 that is an impedance element disposed in the phase adjustment circuit 22 on the side closer to the common junction point N.

The inductor L231 is disposed between the common junction point N and the filters 11 to 13. More specifically, the inductor L231 is disposed between the common junction point N and the phase adjustment circuits 21 and 22. It is assumed that a path interconnecting the inductor L231 and the common junction point N, illustrated in FIG. 11, ideally has an electrical length of zero.

In other words, the configuration of the multiplexer 1A is different from the configuration of the multiplexer 1 according to the first preferred embodiment in that the inductor L211 of the phase adjustment circuit 21 and the inductor L221 of the phase adjustment circuit 22 are replaced with the common inductor L231.

The multiplexer 1A having the above-described configuration also provides satisfactory electrical characteristics with the feature of satisfying a similar complex conjugate relationship to that in the first preferred embodiment.

Second Modification

In the first preferred embodiment, the phase adjustment circuit is described in connection with the case of including an LC matching circuit, for example. However, the phase adjustment circuit may be in the form of a microstripline. A multiplexer including such a phase adjustment circuit is described in a second modification of a preferred embodiment of the present invention.

Figure 12:
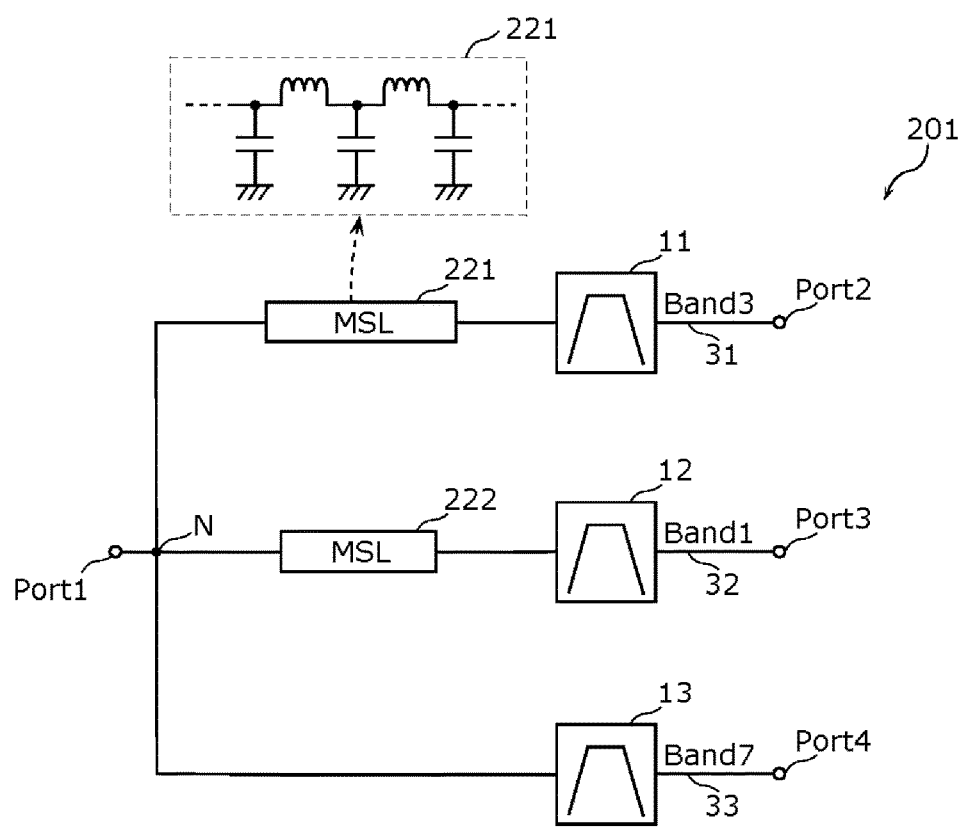
FIG. 12 is a block diagram of a multiplexer according to a second modification of a preferred embodiment of the present invention.

FIG. 12 is a block diagram of a multiplexer 201 according to the second modification.

A multiplexer 201 illustrated in FIG. 12 is different from the multiplexer 1 according to the first preferred embodiment in including microstriplines (MSL) 221 and 222 instead of the phase adjustment circuits 21 and 22. Thus, this modification includes the MSL 221, which is connected in series in the path 31, as a phase adjustment circuit instead of the phase adjustment circuit 21. This modification further includes the MSL 222, which is connected in series in the path 32, as a phase adjustment circuit instead of the phase adjustment circuit 22.

The MSL 221 and the MSL 222 have substantially the same configuration except that filters for which phases are to be adjusted by the MSL 221 and the MSL 222 are different corresponding to the difference in paths to which they are connected. Accordingly, the following description is made about the MSL 221, and description of the MSL 222 is simplified.

The MSL 221 rotates the phase of the filter 11 in the positive direction (clockwise) when viewed from the common junction point N, and a length of the MSL 221 specifies a rotational angle of the phase. On that occasion, by setting the characteristic impedance of the MSL 221 to be equal to the impedance of a transfer system, such as the characteristic impedance of another transfer line, only the rotation of the phase is able to be performed without changing the state of impedance matching in the pass band of the filter 11 (namely, while maintaining the reflection coefficient). It is to be noted that the characteristic impedances of the MSLs 221 and 222 may be each different from the impedance of the transfer system.

Thus, the MSLs 221 and 222 adjust the phases of the corresponding filters such that the above-described complex conjugate relationship is satisfied when viewing the side including the filters 11 to 13 from the common junction point N in the state before the common connection (namely, when viewing the individual filters 11 to 13 in the separated state from the common junction point N).

As illustrated by an equivalent circuit diagram within a dotted-line frame in FIG. 12, an equivalent circuit of the MSL 221 is expressed by inductors connected in series in the path 31, and by capacitors each connected in series in a path interconnecting the path 31 and the ground. The MSL 222 also has a similar equivalent circuit to that described above. In other words, the phase adjustment circuit may include inductors and capacitors, which are arranged as described above, without being limited to the use of MSLs.

Figure 13:
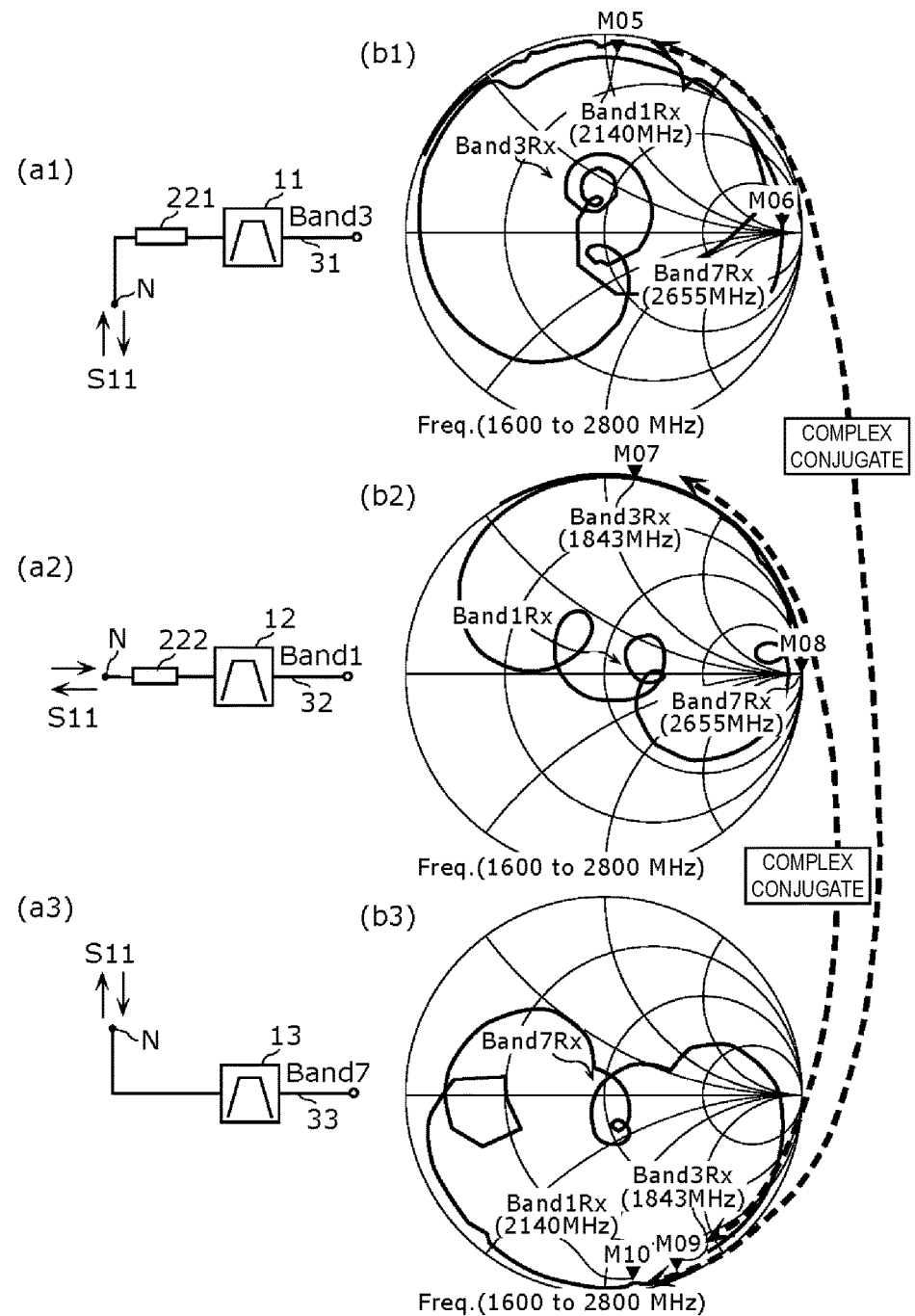
FIG. 13 illustrates Smith charts representing reflection characteristics when viewing the filter side from the common junction point before the common connection in the second modification.

FIG. 13 illustrates Smith charts representing reflection characteristics when viewing the side including the filters 11 to 13 from the common junction point N before the common connection in this modification.

As seen from FIG. 13, in all the filters 11 to 13, the impedances of the individual filters in the separated state are positioned in the central zones of the Smith charts in the corresponding bands as in the first preferred embodiment. On the other hand, in all the filters 11 to 13, the impedances of the individual filters in the separated state are positioned away from the central zones of the Smith charts in the pass bands of the counterpart filters as in the first preferred embodiment.

Focusing on the Band3Rx band that is the pass band of the filter 11, in this modification, the impedances of the filters 12 and 13, i.e., the counterpart-side filters with respect to the filter 11, are in the complex conjugate relationship as in the first preferred embodiment. Focusing on the Band1Rx band that is the pass band of the filter 12, in this modification, the impedances of the filters 11 and 13, i.e., the counterpart-side filters with respect to the filter 12, are in the complex conjugate relationship as in the first preferred embodiment. Focusing on the Band7Rx band that is the pass band of the filter 13, in this modification, the impedances of the filters 11 and 12, i.e., the counterpart-side filters with respect to the filter 13, are infinite (have absolute values of not less than about 500Ω) as in the first preferred embodiment.

By commonly connecting, at the common junction point N, the individual filters 11 to 13 each having the above-described reflection characteristics in the separated state, the reflection characteristics after the common connection when viewed from the common junction point N are given as follows.

Figure 14:
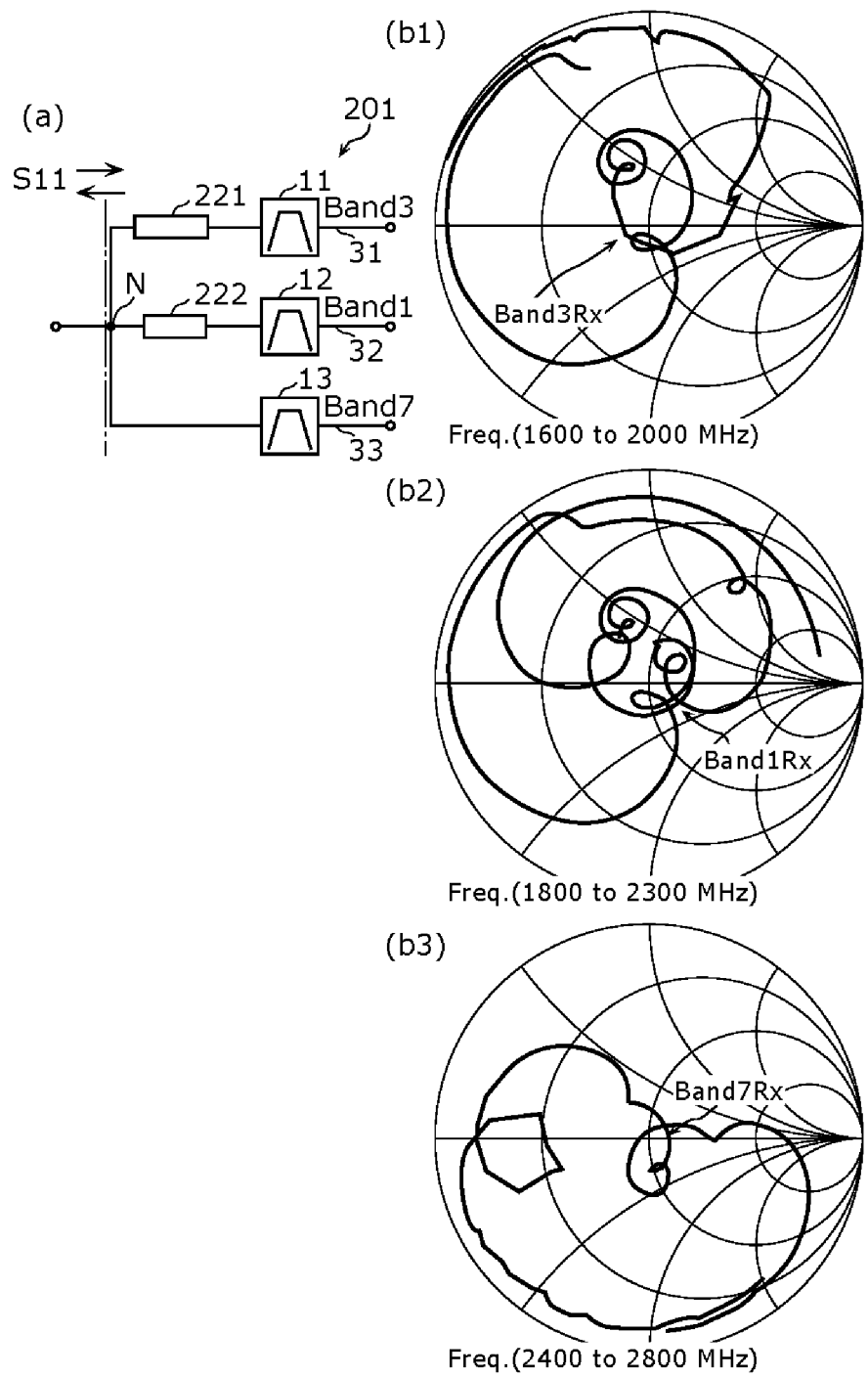
FIG. 14 illustrates Smith charts representing reflection characteristics when viewing the filter side from the common junction point after the common connection in the second modification.

FIG. 14 illustrates Smith charts representing reflection characteristics (impedances) when viewing the side including the filters 11 to 13 from the common junction point N after the common connection in this modification. In FIG. 14, (a) schematically illustrates a state where the reflection characteristics illustrated in (b1) to (b3) of FIG. 14 are measured.

As seen from FIG. 14, the impedances of the filters 11 to 13 when viewed from the common junction point N after the common connection are positioned in the central zones of the Smith charts in all the pass bands of the filters 11 to 13 (e.g., in the Band3Rx band, the Band1Rx band, and the Band7Rx band in this modification). Thus, it is understood that, in the filters 11 to 13 after the common connection, the impedance matching is established in the respective pass bands of those filters in this modification as in the first preferred embodiment.

Figure 15:
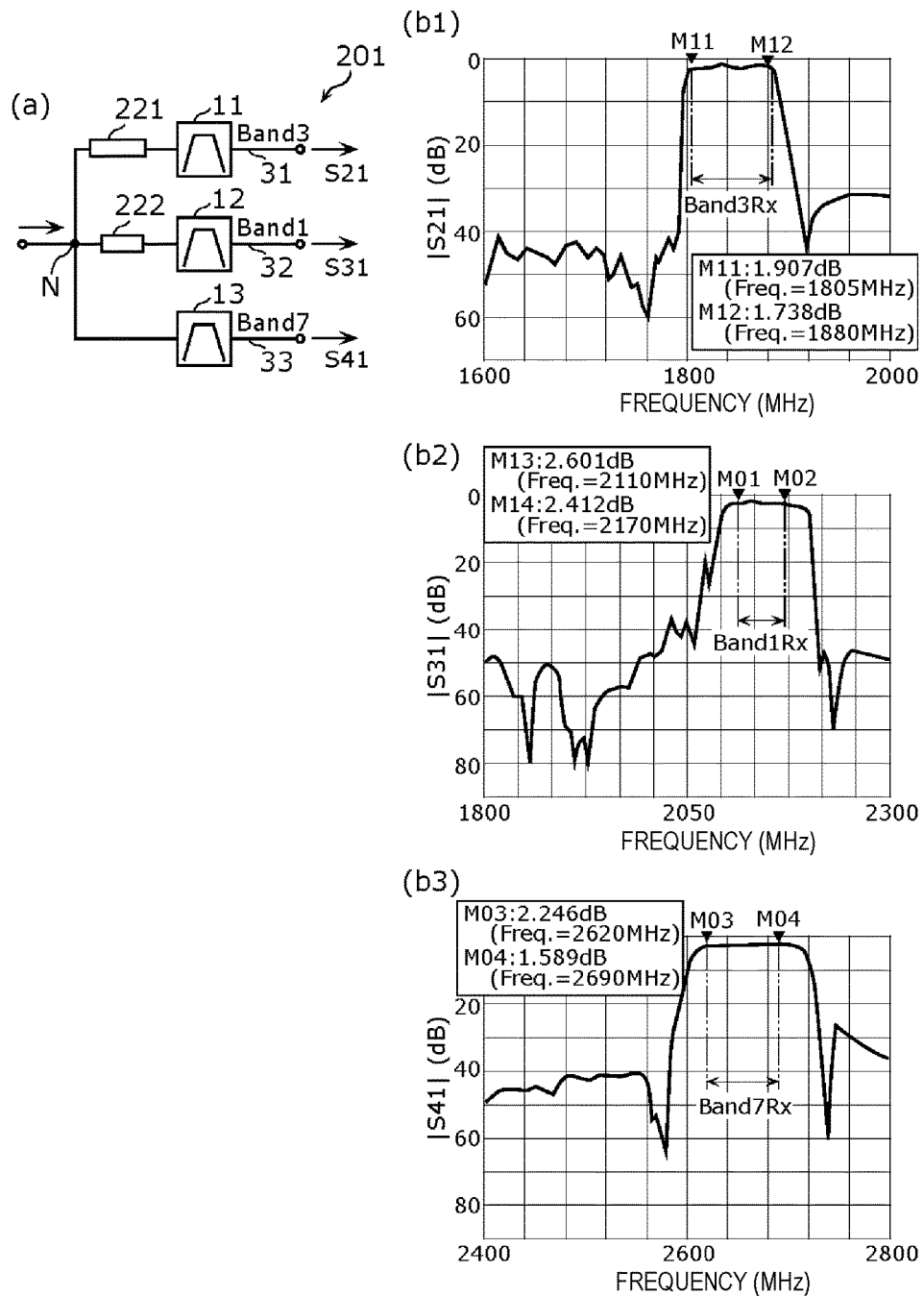
FIG. 15 illustrates filter characteristics after the common connection in the second modification.

FIG. 15 illustrates filter characteristics (bandpass characteristics) after the common connection in this modification.

As seen from FIG. 15, in the filter characteristics of the multiplexer 201 according to this modification, low losses are realized in all the pass bands of the filters 11 to 13 (e.g., in the Band3Rx band, the Band1Rx band, and the Band7Rx band in this modification). In other words, the advantageous effects of providing satisfactory electrical characteristics are able to be obtained with the multiplexer 201 according to this modification.

Thus, the multiplexer 201 according to this modification also provides satisfactory electrical characteristics, as in the first preferred embodiment, with the feature of satisfying the above-described complex conjugate relationship.

Furthermore, according to this modification, since the phase adjustment circuit includes the microstripline (MSL 221 or 222 in this modification), the phase adjustment circuit does not include impedance elements such as an inductor and a capacitor. Therefore, the configuration of the multiplexer 201 is simplified, and man-hours needed in a manufacturing process are reduced corresponding to the simplified configuration.

A component of the phase adjustment circuit not including impedance elements is not limited to the microstripline, and another transfer line, such as a coplanar line or a stripline, may also be used.

Moreover, the phase adjustment circuit may include, instead of the microstripline, impedance elements that realize an equivalent circuit (see the dotted-line frame in FIG. 12) of the microstripline. In other words, the phase adjustment circuit may include inductors connected in series in a path in which the corresponding filter is disposed, and capacitors each connected in series in a path interconnecting the relevant path and the ground. With such a configuration, the impedance when viewing the relevant filter from the common junction point N in the state before the common connection can be moved on the Smith chart toward the capacitive side along a circle passing SHORTED and toward the inductive side along a circle passing OPEN. Thus, since the phase of the above-mentioned impedance is able to be changed, the above-described complex conjugate relationship is able to be satisfied by appropriately adjusting constants of the impedance elements. As a result, the above-described configuration also provides satisfactory electrical characteristics as in the first preferred embodiment.

Third Modification

In the first preferred embodiment and the first and second modifications described above, the impedances of the filters 12 and 13 preferably are in the complex conjugate relationship in the pass band (Band3Rx band) of the filter 11 when viewing the side including the filters 11 to 13 from the common junction point N in the state before the common connection (namely, when viewing the individual filters 11 to 13 in the separated state from the common junction point N). The impedances of the filters 11 and 13 preferably are in the complex conjugate relationship in the pass band (Band1Rx band) of the filter 12 when viewing the side including the filters 11 to 13 in a similar manner to that in the above case. The impedances of the filters 11 and 12 are infinite (have absolute values of not less than about 500Ω) in the pass band (Band7Rx band) of the filter 13 when viewing the side including the filters 11 to 13 in a similar manner to that in the above case. However, combinations of the filters and their pass bands in which the impedances satisfy the complex conjugate relationship are not limited to the above-mentioned ones. Moreover, combinations of the filters and their pass bands in which the impedances become infinite (have absolute values of not less than about 500Ω) are also not limited to the above-mentioned one. From that point of view, an example of such a modified multiplexer will be described in a third modification of a preferred embodiment of the present invention.

Figure 16:
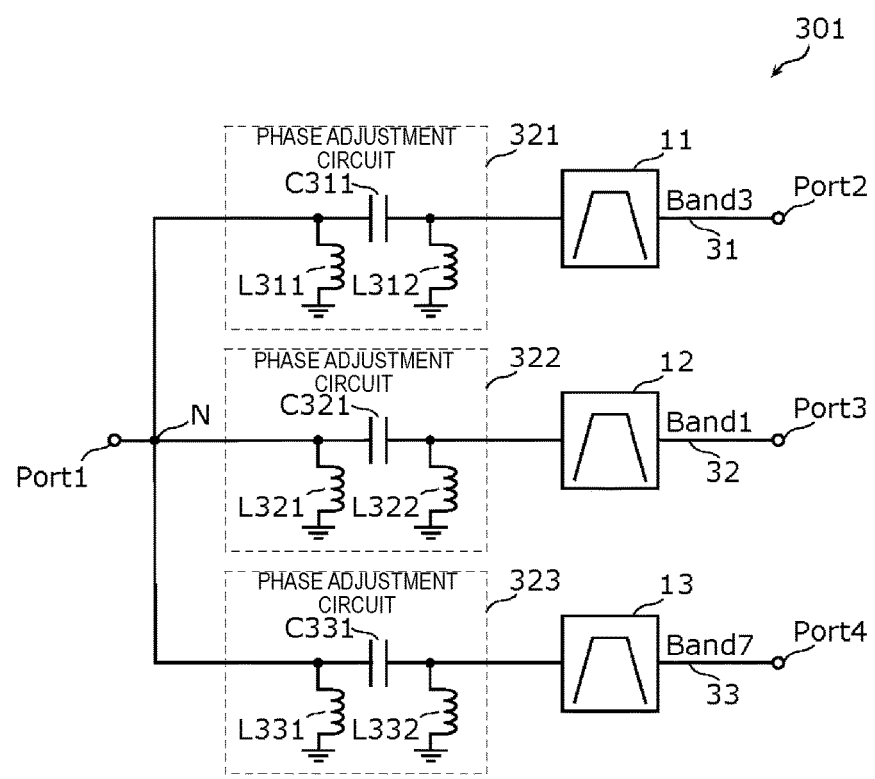
FIG. 16 is a block diagram of a multiplexer according to a third modification of a preferred embodiment of the present invention.

FIG. 16 is a block diagram of a multiplexer 301 according to the third modification.

The multiplexer 301 illustrated in FIG. 16 is different from the multiplexer 1 according to the first preferred embodiment in including phase adjustment circuits 321 and 322 instead of the phase adjustment circuits 21 and 22, respectively, and further including a phase adjustment circuit 323 between the common junction point N and the filter 13.

The phase adjustment circuits 321 to 323 are each an LC matching circuit including one or more inductors and one or more capacitors, like the phase adjustment circuits 21 and 22 in the first preferred embodiment. More specifically, the phase adjustment circuit 321 includes a capacitor C311 and inductors L311 and L312, the phase adjustment circuit 322 includes a capacitor C321 and inductors L321 and L322, and the phase adjustment circuit 322 includes a capacitor C331 and inductors L331 and L332.

The phase adjustment circuits 321 to 323 are similar in configuration to the phase adjustment circuits 21 and 22 except that the circuit constants of those phase adjustment circuits are different corresponding to the differences in combination of filters and their pass bands in which impedances are in the complex conjugate relationship or infinite (have absolute values of not less than about 500Ω). Accordingly, description of detailed configurations of those phase adjustment circuits is omitted.

Figure 17:
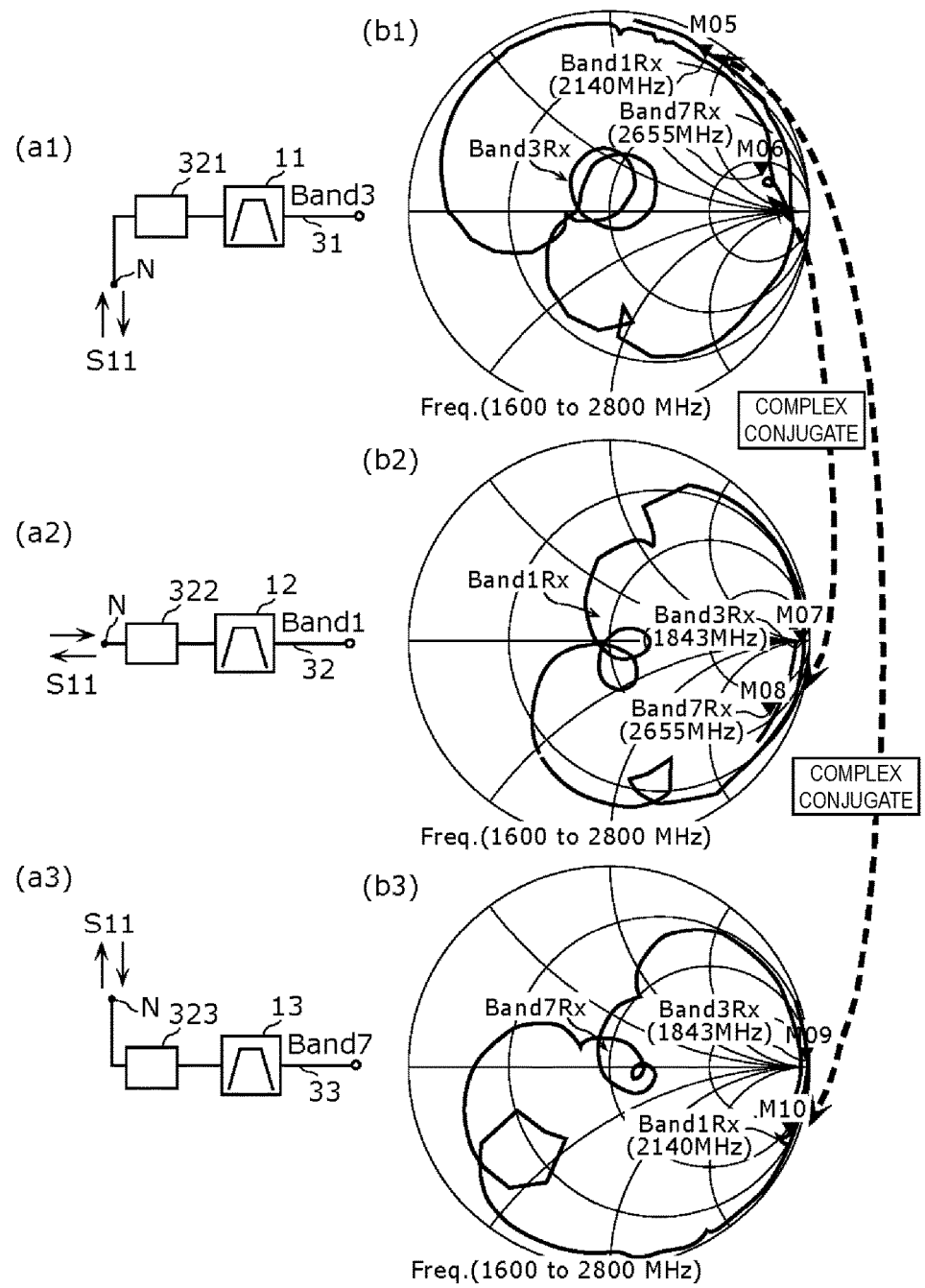
FIG. 17 illustrates Smith charts representing reflection characteristics when viewing the filter side from the common junction point before the common connection in the third modification.

FIG. 17 illustrates Smith charts representing reflection characteristics when viewing the side including the filters 11 to 13 from the common junction point N before the common connection in this modification.

As seen from FIG. 17, in all the filters 11 to 13, the impedances of the individual filters in the separated state are positioned in the central zones of the Smith charts in the corresponding bands as in the first preferred embodiment. Furthermore, in all the filters 11 to 13, the impedances of the individual filters in the separated state are positioned away from the central zones of the Smith charts in the pass bands of the counterpart filters as in the first preferred embodiment.

Focusing on the Band3Rx band that is the pass band of the filter 11, in this modification, the impedances of the filters 12 and 13, i.e., the counterpart-side filters with respect to the filter 11, are infinite (have absolute values of not less than about 500Ω) unlike the first preferred embodiment. Focusing on the Band1Rx band that is the pass band of the filter 12, in this modification, the impedances of the filters 11 and 13, i.e., the counterpart-side filters with respect to the filter 12, are in the complex conjugate relationship as in the first preferred embodiment. Focusing on the Band7Rx band that is the pass band of the filter 13, in this modification, the impedances of the filters 11 and 12, i.e., the counterpart-side filters with respect to the filter 13, are in the complex conjugate relationship unlike the first preferred embodiment.

By commonly connecting, at the common junction point N, the individual filters 11 to 13 each having the above-described reflection characteristics in the separated state, the reflection characteristics after the common connection when viewed from the common junction point N are given as follows.

Figure 18:
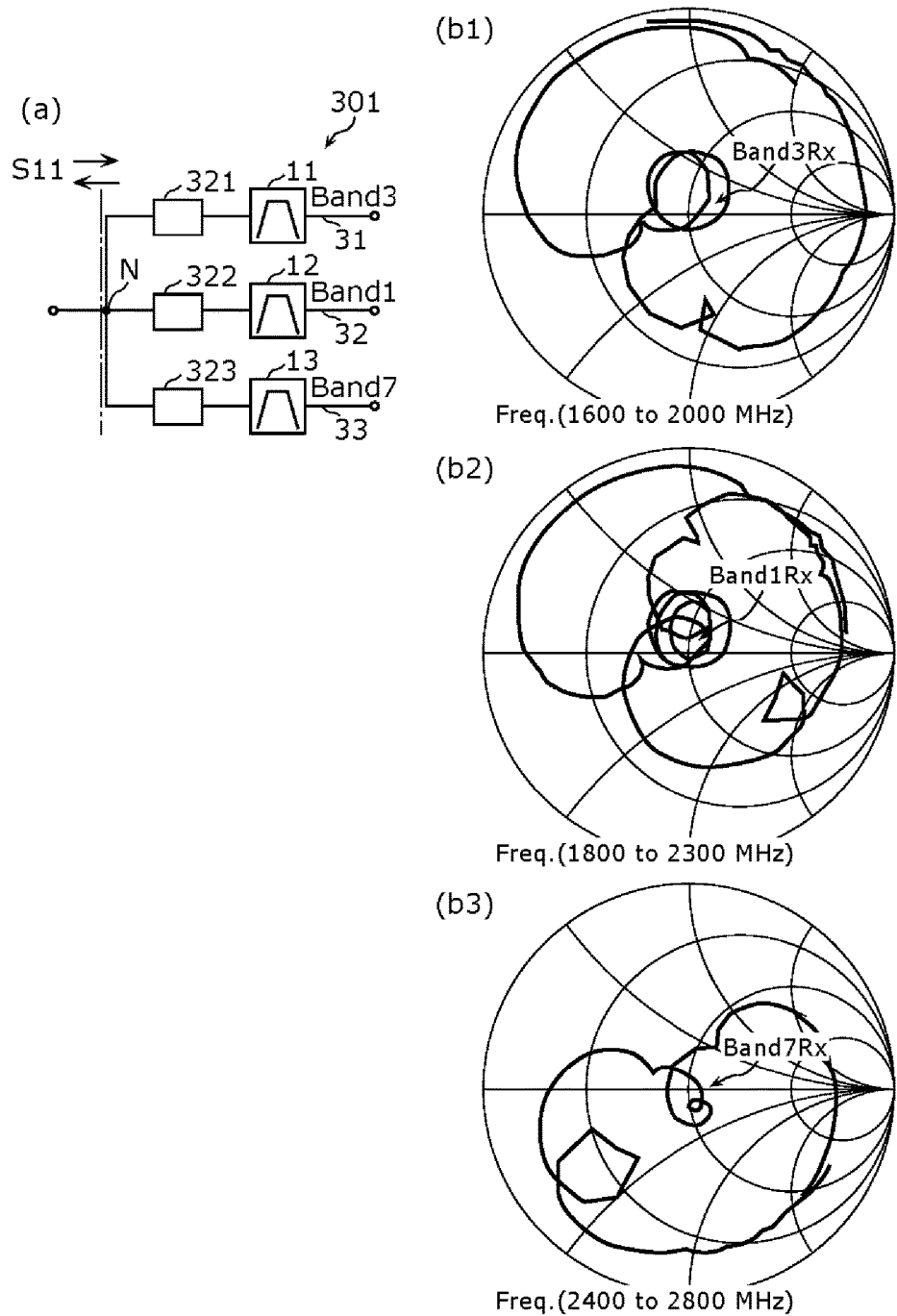
FIG. 18 illustrates Smith charts representing reflection characteristics when viewing the filter side from the common junction point after the common connection in the third modification.

FIG. 18 illustrates Smith charts representing reflection characteristics (impedances) when viewing the side including the filters 11 to 13 from the common junction point N after the common connection in this modification. In FIG. 18, (a) schematically illustrates a state where the reflection characteristics illustrated in (b1) to (b3) of FIG. 18 are measured.

As seen from FIG. 18, the impedances of the filters 11 to 13 when viewed from the common junction point N after the common connection are positioned in the central zones of the Smith charts in all the pass bands of the filters 11 to 13 (e.g., in the Band3Rx band, the Band1Rx band, and the Band7Rx band in this modification). Thus, it is understood that, even in this modification different from the first preferred embodiment in the combination of the filters and their pass bands in which the impedances are in the complex conjugate relationship or infinite (have absolute values of not less than about 500Ω), the filters 11 to 13 after the common connection exhibit the impedance matching in the respective pass bands of those filters as in the first preferred embodiment.

Figure 19:
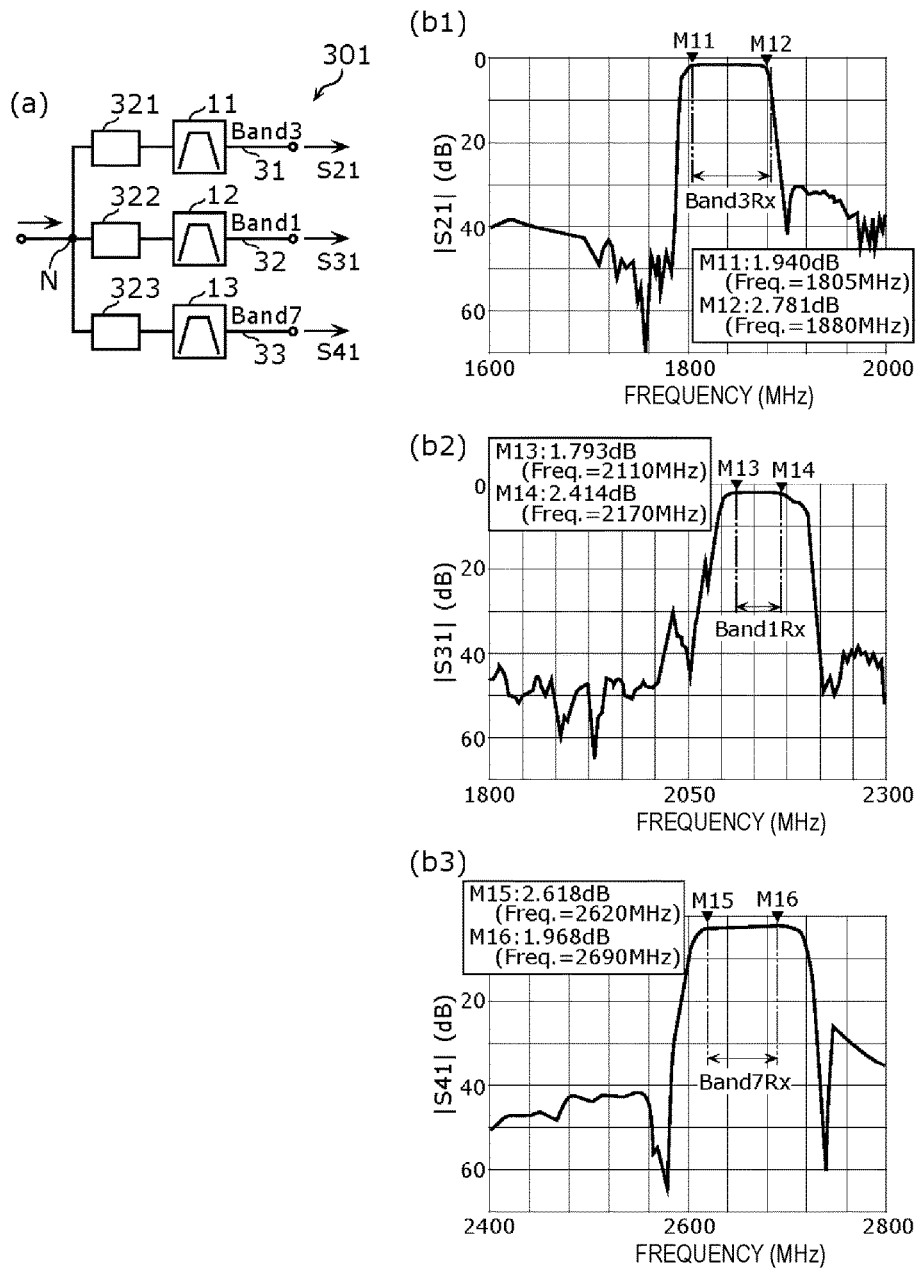
FIG. 19 illustrates filter characteristics after the common connection in the third modification.

FIG. 19 illustrates filter characteristics (bandpass characteristics) after the common connection in this modification.

As seen from FIG. 19, in the filter characteristics of the multiplexer 301 according to this modification, low losses are realized in all the pass bands of the filters 11 to 13 (e.g., in the Band3Rx band, the Band1Rx band, and the Band7Rx band in this modification). In other words, the advantageous effects of providing satisfactory electrical characteristics are able to be obtained with the multiplexer 301 according to this modification.

Thus, the multiplexer 301 according to this modification\also provides satisfactory electrical characteristics, as in the first preferred embodiment, with the feature of satisfying the above-described complex conjugate relationship.

Fourth Modification

In the first preferred embodiment and the first to third modifications described above, in each of the number n (three in the above description) of pass bands, the impedances of the (n−1) number of filters (two counterpart-side filters in the above description) of which pass bands are the pass bands of the counterpart-side filters with respect to the relevant pass band are in the complex conjugate relationship or infinite (have absolute values of not less than about 500Ω). However, the impedances are not always required to be in the complex conjugate relationship or infinite (have absolute values of not less than about 500Ω) in any of the pass bands. From that point of view, an example of such a modified multiplexer will be described in a fourth modification of a preferred embodiment of the present invention.

Figure 20:
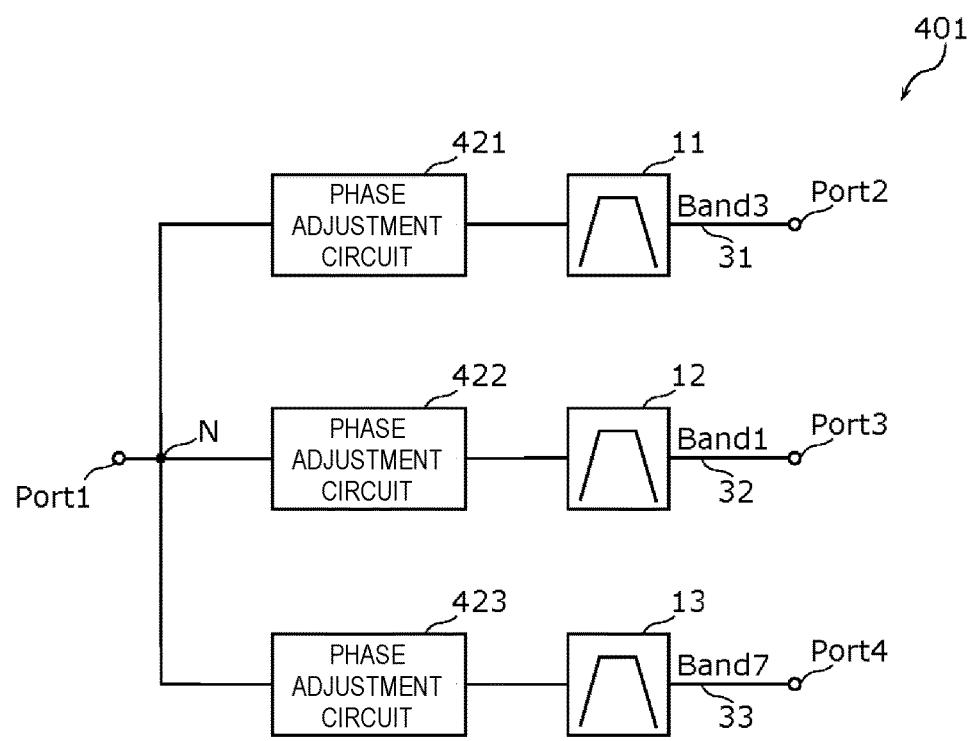
FIG. 20 is a block diagram of a multiplexer according to a fourth modification of a preferred embodiment of the present invention.

FIG. 20 is a block diagram of a multiplexer 401 according to the fourth modification.

The multiplexer 401 illustrated in FIG. 20 is different from the multiplexer 1 according to the first preferred embodiment in including phase adjustment circuits 421 and 422 instead of the phase adjustment circuits 21 and 22, respectively, and further including a phase adjustment circuit 423 between the common junction point N and the filter 13.

The phase adjustment circuits 421 to 423 individually correspond to the filters 11 to 13 in the mentioned order, and are disposed between the corresponding filters and the common junction point N, respectively. Although configurations of the phase adjustment circuits 421 to 423 are not limited to particular ones, they may be similar, by way of example, to those of the phase adjustment circuits in the first embodiment and the first to third modifications described above. By appropriately adjusting respective constants, etc. of the phase adjustment circuits 421 to 423, the pass band of the counterpart-side filters can be made, for example, as far as open with respect to the impedance of corresponding one of the filters.

Figure 21:
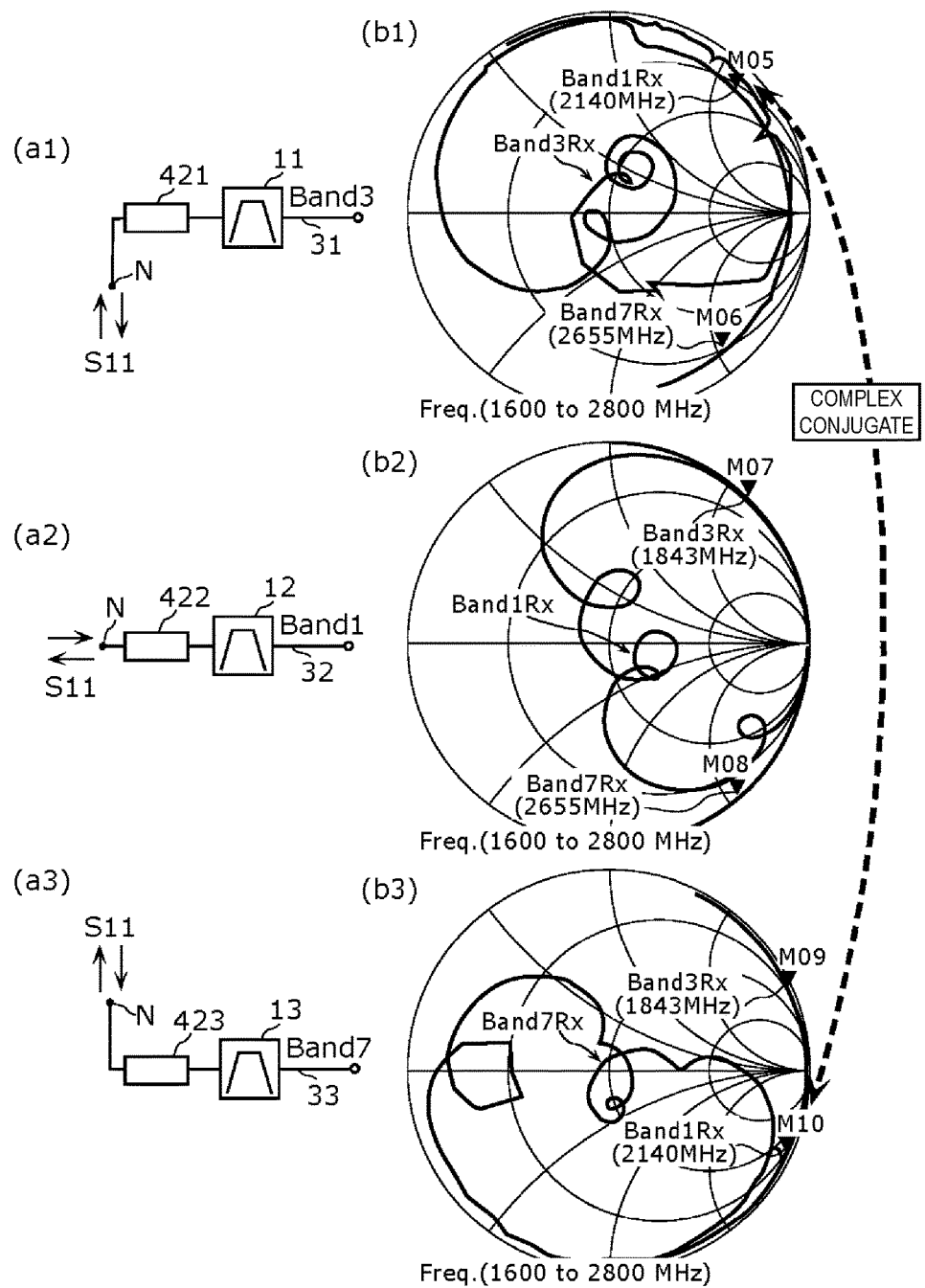
FIG. 21 illustrates Smith charts representing reflection characteristics when viewing the filter side from the common junction point before the common connection in the fourth modification.

FIG. 21 illustrates Smith charts representing reflection characteristics when viewing the side including the filters 11 to 13 from the common junction point N before the common connection in this modification.

As seen from FIG. 21, in all the filters 11 to 13, the impedances of the individual filters in the separated state are positioned in the central zones of the Smith charts in the corresponding bands as in the first preferred embodiment. Furthermore, in all the filters 11 to 13, the impedances of the individual filters in the separated state are positioned away from the central zones of the Smith charts in the pass bands of the counterpart-side filters as in the first preferred embodiment.

Focusing on the Band1Rx band that is the pass band of the filter 12, in this modification, the impedances of the filters 11 and 13 are in the complex conjugate relationship as in the first preferred embodiment. However, focusing on the Band3Rx band that is the pass band of the filter 11, in this modification, the impedances of the filters 12 and 13 are positioned in the inductive region and they are not in the complex conjugate relationship unlike the first preferred embodiment. Focusing on the Band7Rx band that is the pass band of the filter 13, in this modification, the impedances of the filters 11 and 12 are both not infinite (do not have absolute values of not less than about 500Ω) unlike the first preferred embodiment.

By commonly connecting, at the common junction point N, the individual filters 11 to 13 each having the above-described reflection characteristics in the separated state, the reflection characteristics after the common connection when viewed from the common junction point N are given as follows.

Figure 22:
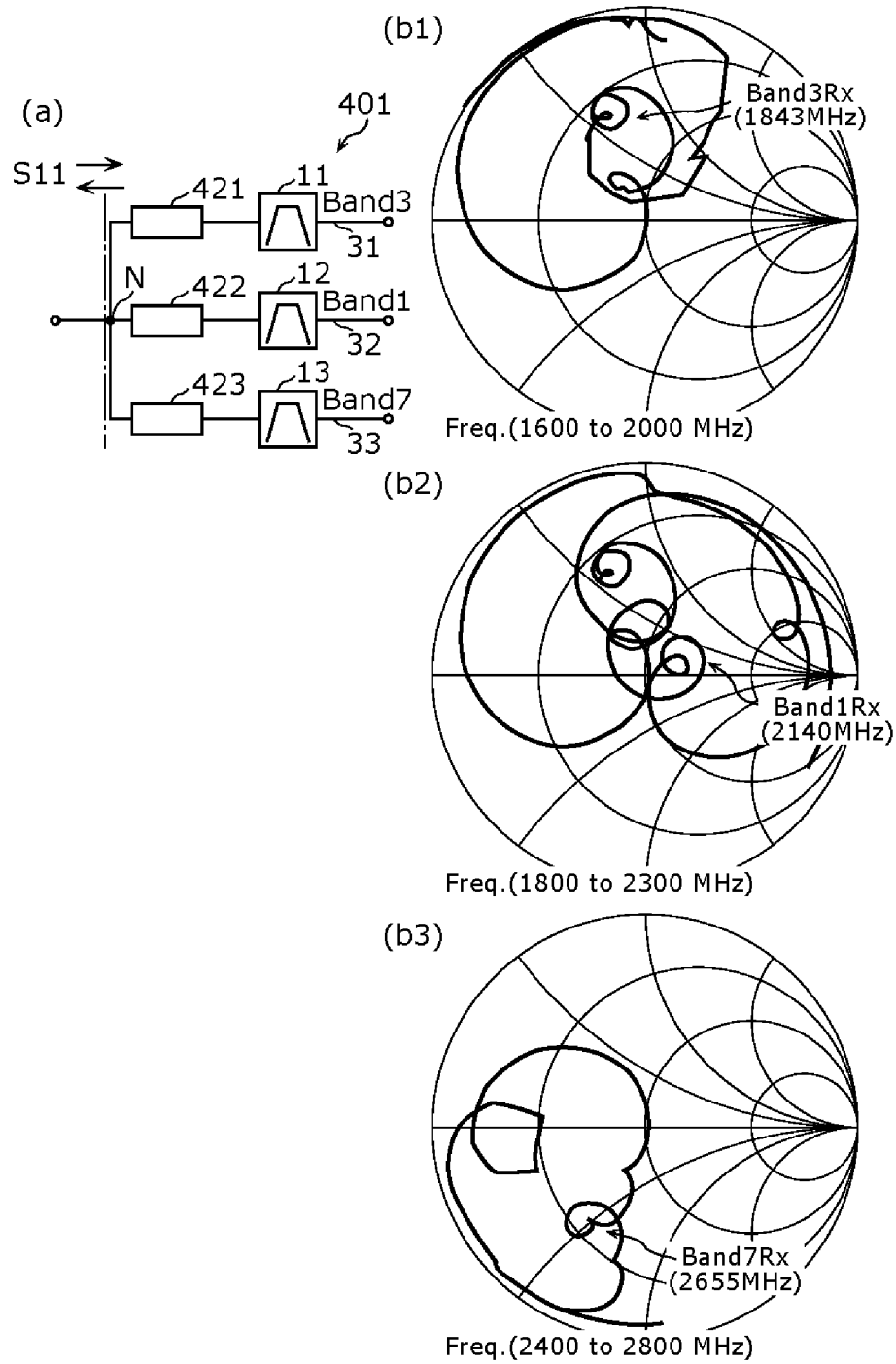
FIG. 22 illustrates Smith charts representing reflection characteristics when viewing the filter side from the common junction point after the common connection in the fourth modification.

FIG. 22 illustrates Smith charts representing reflection characteristics (impedances) when viewing the side including the filters 11 to 13 from the common junction point N after the common connection in this modification. In FIG. 22, (a) schematically illustrates a state where the reflection characteristics illustrated in (b1) to (b3) of FIG. 22 are measured.

As seen from FIG. 22, the impedances of the filters 11 to 13 when viewed from the common junction point N after the common connection are positioned such that, while the impedance in the Band1Rx band is positioned in the central zone of the Smith chart, the impedance in the Band3Rx band is positioned away from the central zone of the Smith chart toward the inductive side and the impedance in the Band7Rx band is positioned away from the central zone of the Smith chart toward the capacitive side.

The reason is as follows. Focusing on the filter 11, the impedances of the individual counterpart-side filters (filters 12 and 13) in the separated state when viewed from the common junction point N are not in the complex conjugate relationship and are positioned offset toward the inductive side in the pass band of the filter 11 (i.e., in the Band3Rx band). Moreover, focusing on the filter 13, the impedances of the individual counterpart-side filters (filters 11 and 12) in the separated state when viewed from the common junction point N are not in the complex conjugate relationship and are positioned offset toward the capacitive side in the pass band of the filter 13 (i.e., in the Band7Rx band).

Stated in another way, in this modification, when viewing the side including the filters 11 to 13 from the common junction point N after the common connection, the state of impedance matching degrades (namely, the reflection coefficient increases) in part of the pass bands (i.e., in the Band3Rx band and the Band7Rx band) in comparison with the first preferred embodiment.

Figure 23:
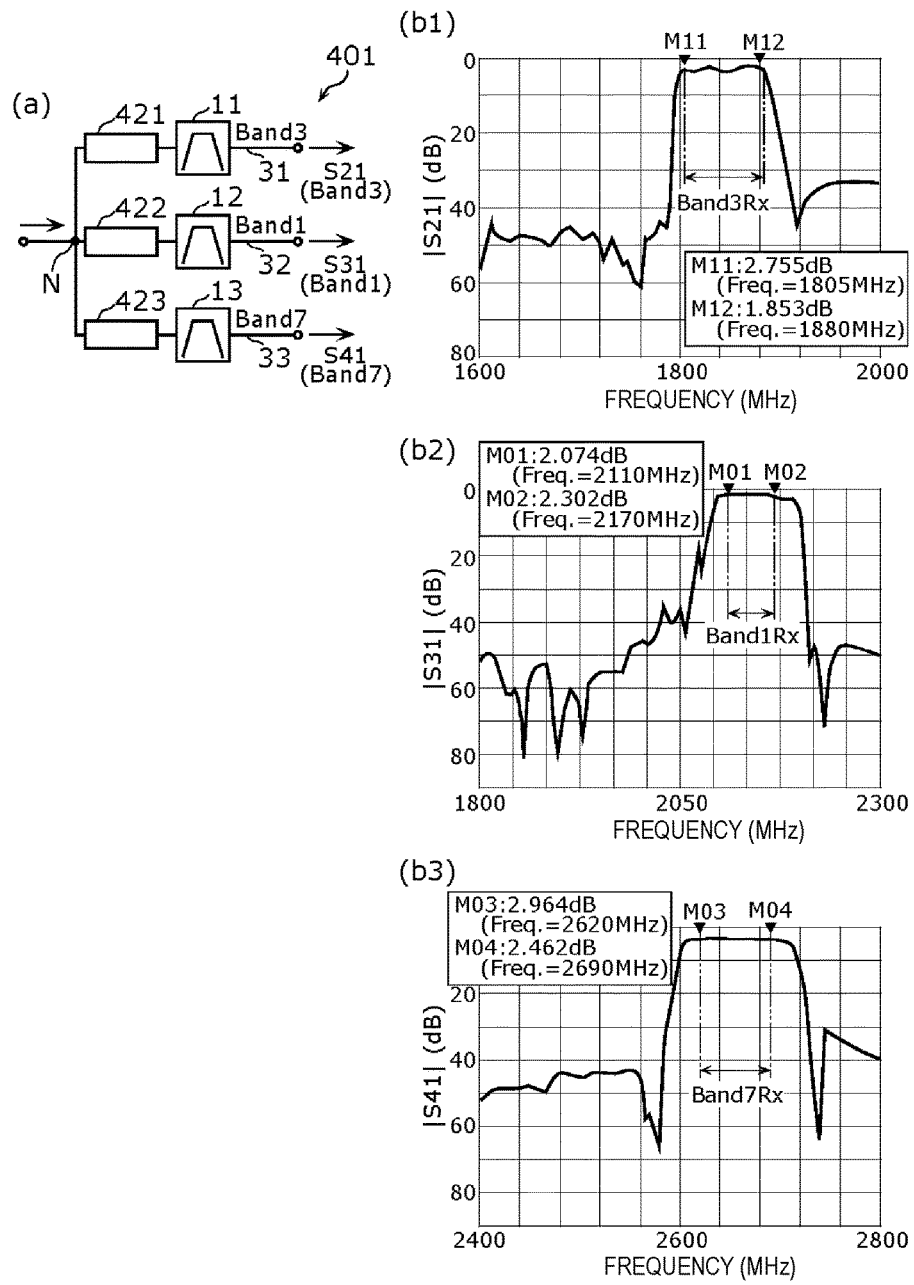
FIG. 23 illustrates filter characteristics after the common connection in the fourth modification.

FIG. 23 illustrates filter characteristics (bandpass characteristics) after the common connection in this modification.

As seen from comparison between FIG. 23 and FIG. 6, in the filter characteristics of the multiplexer 401 according to this modification, the filter characteristics in the Band3Rx band and the Band7Rx band slightly degrade (namely, losses slightly increase) in comparison with the filter characteristics of the multiplexer 1 according to the first preferred embodiment, whereas losses in the Band1Rx band are equivalent. In other words, even the multiplexer 401 according to this modification also provides the advantageous effect of providing satisfactory electrical characteristics (namely, suppressing the losses) in at least one pass band (e.g., the Band1Rx band in this modification).

Thus, the multiplexer 401 according to this modification also provides satisfactory electrical characteristics in at least one pass band, as in the first preferred embodiment, with the feature of satisfying the above-described complex conjugate relationship.

The above-described multiplexer 401 is able to be applied to a situation in which demanded upper limits of the losses are different between or among a plurality of pass bands depending on demanded specifications and so on. More specifically, individual filters are designed to satisfy the above-described complex conjugate relationship for only other filters than a filter having, as its pass band, some Band for which the upper limit of losses is strictly demanded. With that design, low losses are able to be realized in the filter characteristics of the filter having, as its pass band, the Band for which the upper limit of losses is strictly demanded, and the demanded specifications are able to be satisfied. At the same time, the circuit configuration of the multiplexer 401 is prevented from being complicated, and man-hours needed for adjusting constants of circuit elements, etc. are reduced.

Fifth Modification

The first preferred embodiment and the first to fourth modifications have been described on an assumption that the number n (for example, three filters 11 to 13 in the above description) of filters are each a bandpass filter. In other words, the above description is made with regard to the multiplexer including the number n of bandpass filters. However, the preferred embodiments of the present invention can be further applied to a multiplexer including a band rejection filter, such as a notch filter, without being limited to the bandpass filter. From that point of view, an example of such a modified multiplexer will be described in a fifth modification of a preferred embodiment of the present invention.

Figure 24:
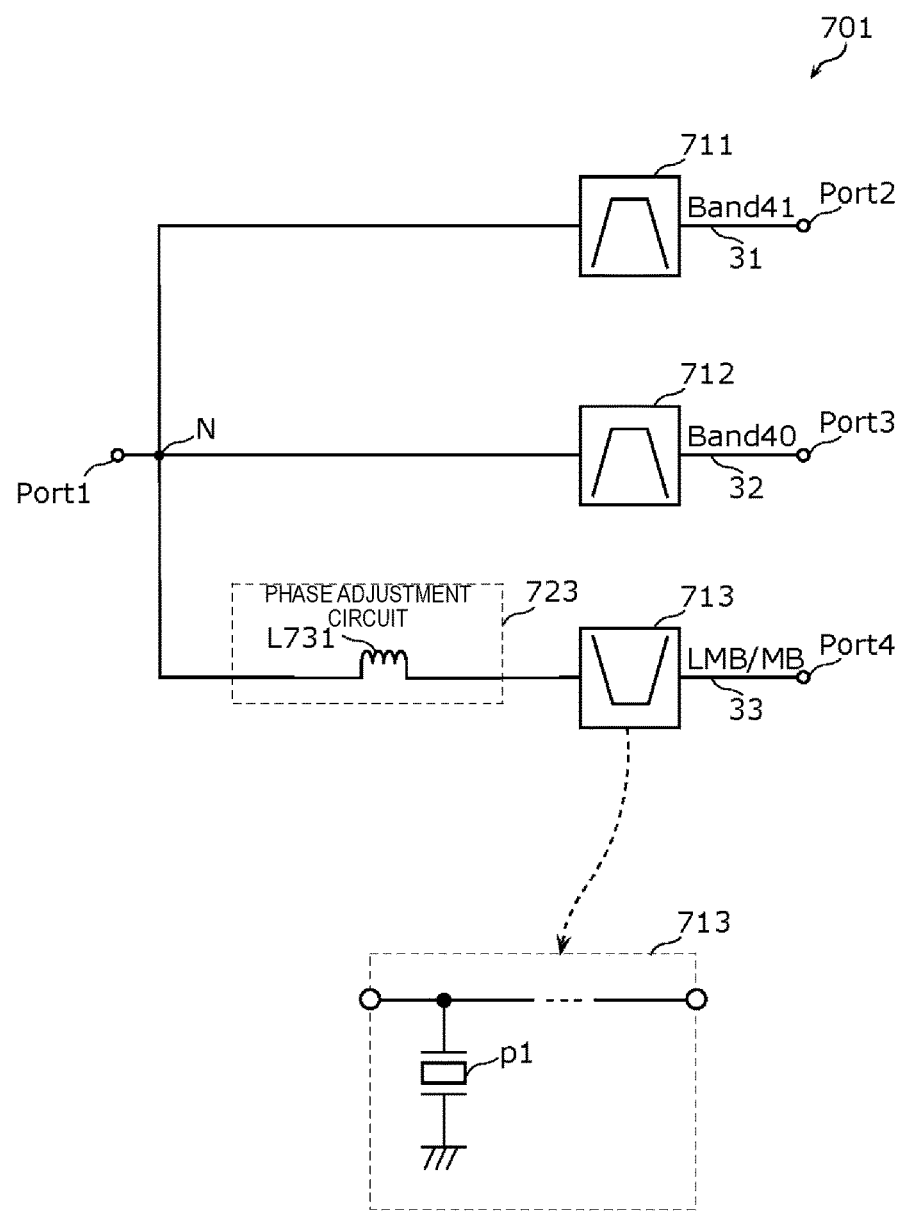
FIG. 24 is a block diagram of a multiplexer according to a fifth modification of a preferred embodiment of the present invention.

FIG. 24 is a block diagram of a multiplexer 701 according to this modification.

The multiplexer 701 illustrated in FIG. 24 is different from the multiplexer 1 according to the first preferred embodiment in including filters 711 to 713 instead of the filters 11 to 13, respectively, and further including a phase adjustment circuit 723 without including the phase adjustment circuits 21 and 22.

The filter 711 is located in the path 31 connecting the common terminal Port1 and the individual terminal Port2 to each other. In this modification, the filter 711 is a bandpass filter (band passing filter) preferably having a pass band given as Band 41 of the LTE, for example.

The filter 712 is located in the path 32 connecting the common terminal Port1 and the individual terminal Port3 to each other. In this modification, the filter 712 is a bandpass filter having a pass band given as Band 40 of the LTE. It is to be noted that, in this modification, the pass band of the filter 712 is restricted to a lower frequency-side channel of Band 40 to ensure attenuation in ISM 2.4 G band, for example.

The filter 713 is located in the path 33 connecting the common terminal Port1 and the individual terminal Port4 to each other. In this modification, the filter 713 is a notch filter (band rejection filter) preferably having, as an attenuation band, Band 41 and 40 of the LTE (called first frequency band), for example. Thus, the pass band of the filter 713 is different from the pass bands of the filters 711 and 712. More specifically, a pass band frequency of the filter 713 on the lower frequency side is lower than respective pass band frequencies of the filters 711 and 712. In this modification, the filter 713 is a notch filter having a pass band on the lower frequency side, which is given as LMB (low-middle band: about 1476 MHz to about 2026 MHz) and MB (middle band: about 2110 MHz to about 2200 MHz), for example. Examples of LMB and MB are Band 1, Band 2, Band 3, Band 4, Band 11, Band 21, Band 25, Band 32, Band 34, Band 39, and Band 66.

In this modification, each of the filters 711 to 713 preferably is an acoustic wave filter including one or more acoustic wave resonators, like the filters 11 to 13 in the first preferred embodiment.

As illustrated in FIG. 24, one of the one or more acoustic wave resonators of the filter 713 on the side closest to the common junction point N is a parallel resonator p1 (parallel arm resonator) that is connected in series in a path interconnecting the path 33 in which the filter 713 is disposed and the ground. In other words, the filter 713 is an acoustic wave filter including, at a start point of the filter, the parallel resonator p1 on the side closest to the common junction point N.

The parallel resonator p1 may include a plurality of divided resonators that are obtained, for example, by dividing the one parallel resonator p1 in series. Furthermore, the parallel resonator p1 is not always required to be directly connected to the path 33 or the ground, and it may be connected thereto via another parallel resonator, an impedance element, or the like.

The phase adjustment circuit 723 adjusts a phase of the filter 713 such that the complex conjugate relationship, described above in the first preferred embodiment, is satisfied when viewing the side including the three filters 711 to 713 from the common junction point N in the state before the common connection where the three paths 31 to 33 are not commonly connected. More specifically, the phase adjustment circuit 723 is an inductor L731 disposed between the common junction point N and the filter 713 and connected in series in the path 33 where the filter 713 is disposed.

Thus, in the multiplexer 701 according to this modification, at least one filter (e.g., the filter 713 in this modification) includes a notch filter, and a serial inductor (e.g., the inductor L731) is inserted on the side closer to the common junction point N of the notch filter. Furthermore, the pass band frequencies of the three filters 711 to 713 are not overlapped with one another, and the pass band frequency of the filter 713 (notch filter) is lower than the pass band frequencies of the other filters 711 and 712. Moreover, the filter 713 includes the acoustic wave resonator (e.g., the parallel resonator p1) that is shunt-connected to the above-mentioned serial inductor.

Characteristics of the multiplexer 701 will be described below.

Figure 25:
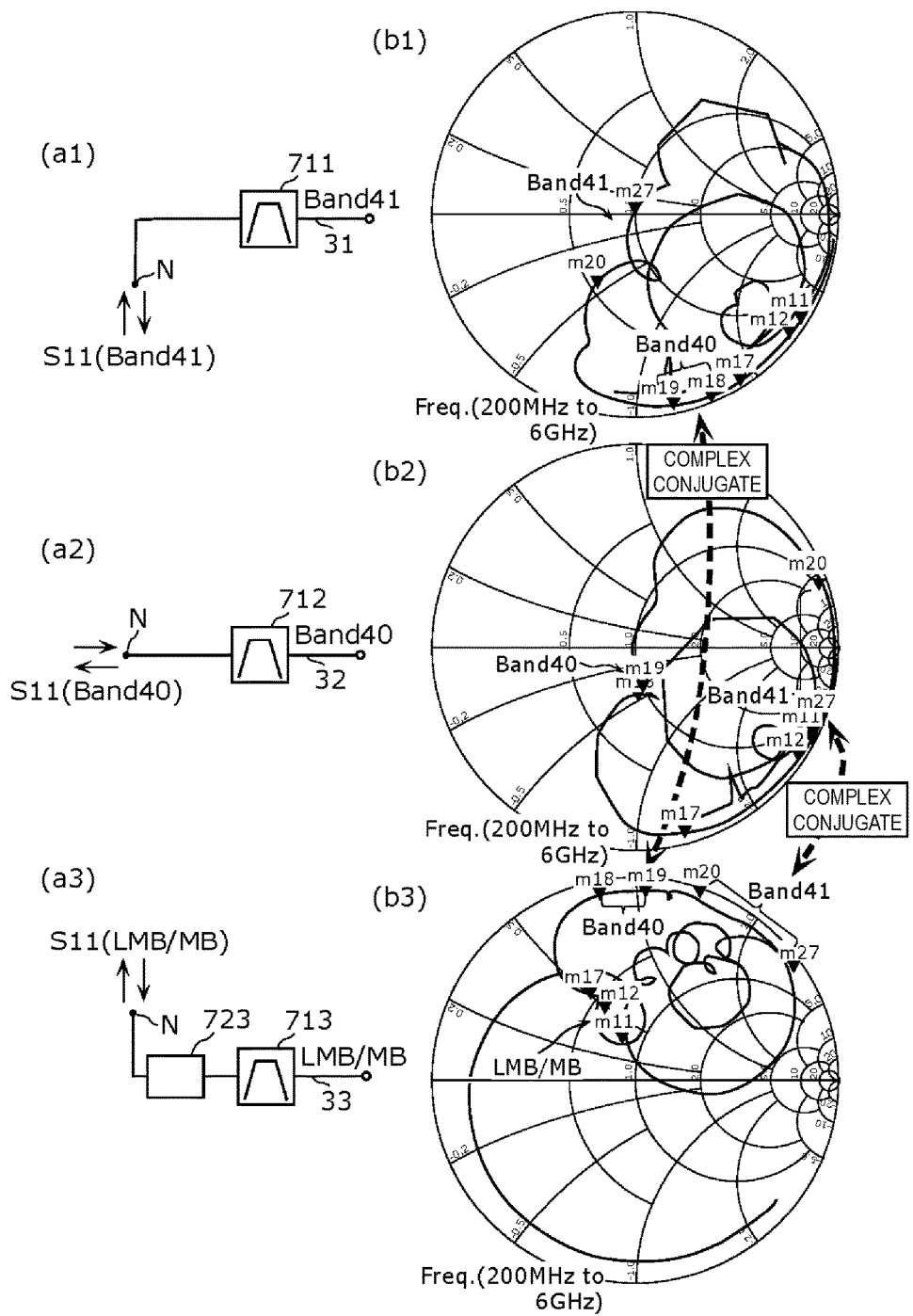
FIG. 25 illustrates Smith charts representing reflection characteristics when viewing the filter side from the common junction point before the common connection in the fifth modification.

FIG. 25 illustrates Smith charts representing reflection characteristics when viewing the side including the filters 711 to 713 from the common junction point N before the common connection in this modification.

As seen from FIG. 25, in all the filters 711 to 713, the impedances of the individual filters in the separated state are positioned in the central zones of the Smith charts in the corresponding bands as in the first preferred embodiment. Furthermore, in all the filters 711 to 713, the impedances of the individual filters in the separated state are positioned away from the central zones of the Smith charts in the pass bands of the counterpart-side filters as in the first preferred embodiment.

Focusing on Band 41 that is the pass band of the filter 711, the impedances of the filters 712 and 713 are in the complex conjugate relationship. Focusing on Band 40 that is the pass band of the filter 712, the impedances of the filters 711 and 713 are in the complex conjugate relationship.

By commonly connecting, at the common junction point N, the individual filters 711 to 713 each having the above-described reflection characteristics in the separated state, the impedance matching is able to be established in each of Band 41 and 40 in the reflection characteristics after the common connection when viewed from the common junction point N.

Figure 26:
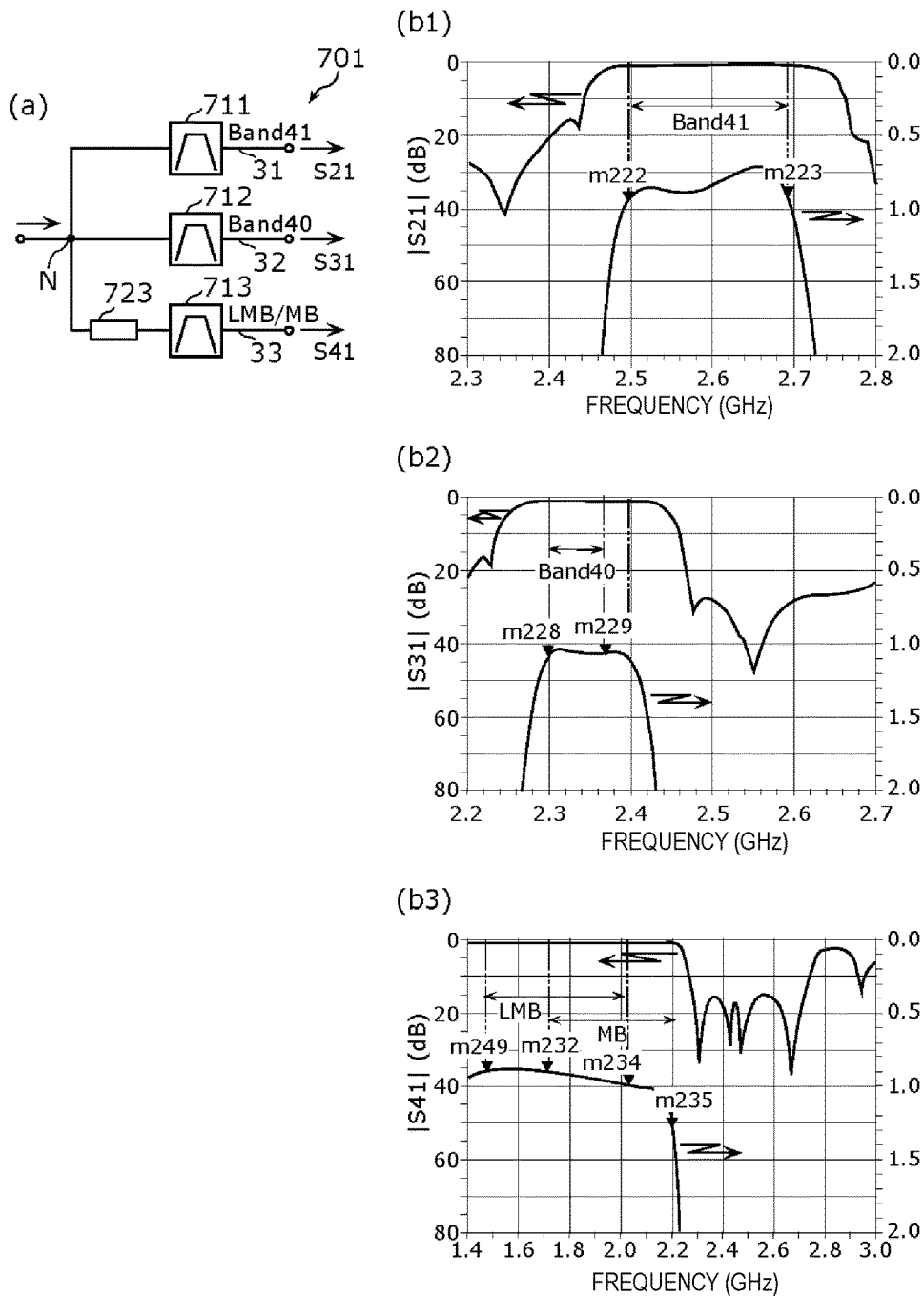
FIG. 26 illustrates filter characteristics after the common connection in the fifth modification.

FIG. 26 illustrates filter characteristics (bandpass characteristics) after the common connection in this modification.

As seen from FIG. 26, the multiplexer 701 according to this modification also provides the advantageous effect of providing satisfactory electrical characteristics (namely, suppressing the losses) in all the pass bands (Band 40, Band 41, and LMB-MB in this modification) as in the first preferred embodiment. The reason why the above-mentioned advantageous effect is able to be obtained will be described below with reference to FIGS. 27 and 28 by comparing this modification and a comparative example of this modification.

Figure 27:
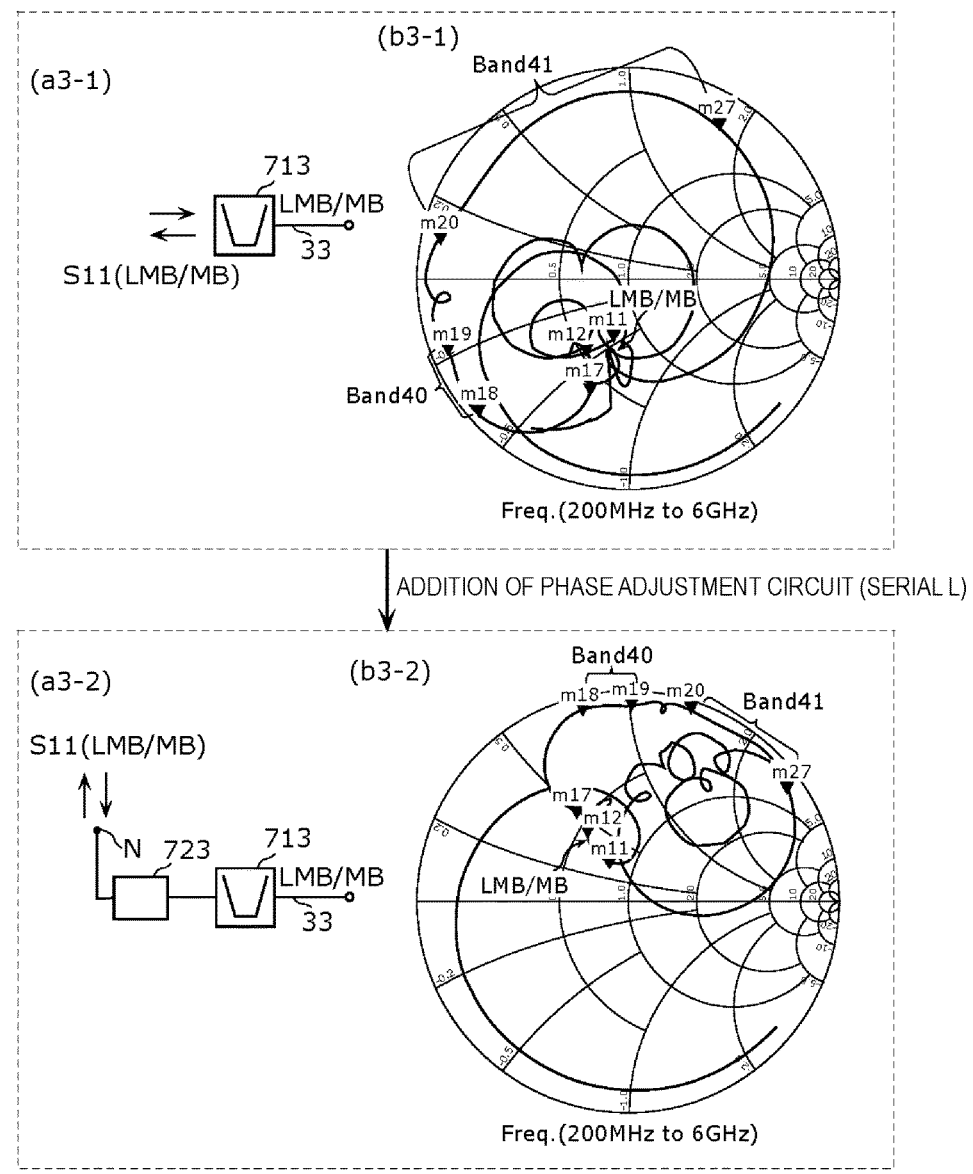
FIG. 27 illustrates reflection characteristics of a filter (notch filter) in the fifth modification.
Figure 28:
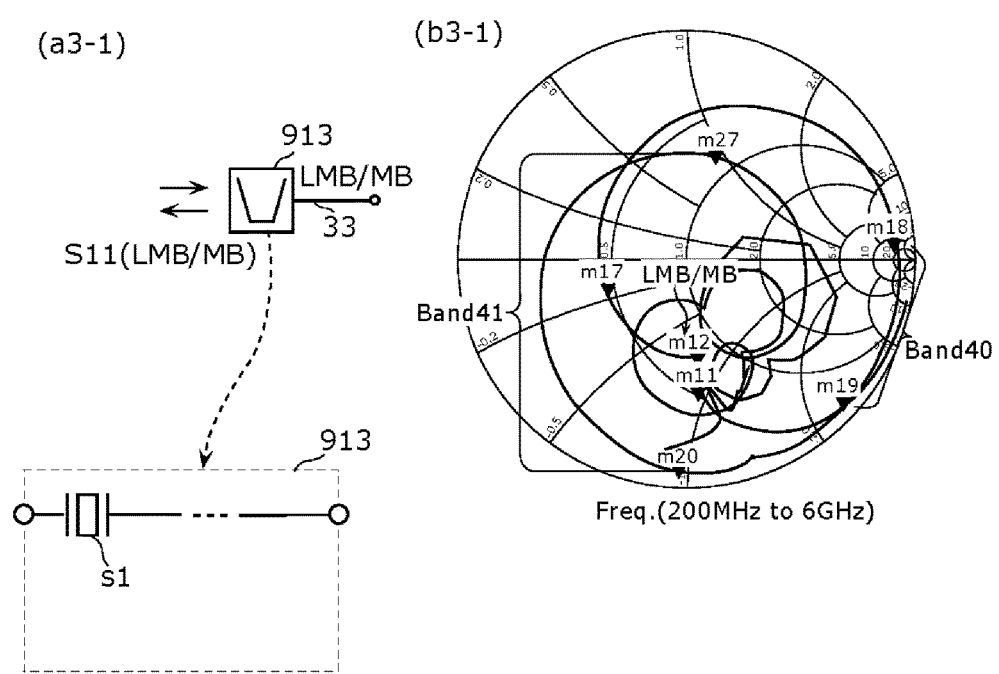
FIG. 28 illustrates reflection characteristics of a filter (notch filter) in a comparative example of the fifth modification.

FIG. 27 illustrates reflection characteristics of the filter 713 (notch filter) in this modification. FIG. 28 illustrates reflection characteristics of a filter 913 (notch filter) in a comparative example of this modification. The filter 913 in the comparative example is similar to the filter 713 in this modification except that the acoustic wave resonator disposed on the side closer to the common junction point N is a serial resonator s1 (serial arm resonator) connected in series in the path 33. Accordingly, detailed description of the filter 913 is omitted.

The Smith charts illustrated at the upper right denoted by (b3-1) in FIG. 27 and at the right denoted by (b3-1) in FIG. 28 represent the impedances of the filters 713 and 913 on the side including the common junction point N. As seen from comparing those Smith charts, the filter 713 in which the acoustic wave resonator on the side closer to the common junction point N is the parallel resonator p1 is able to rotate its impedance at each of pass band frequencies of the counterpart-side filters (e.g., in Band 41 as the pass band of the filter 711 and Band 40 as the pass band of the filter 712) clockwise relative to the impedance of the filter 913 in which the acoustic wave resonator on the side closer to the common junction point N is the serial resonator s1, thereby advancing the phase.

In this modification, as illustrated in a lower column of FIG. 27, with the addition of the phase adjustment circuit 723 including the inductor L731 that is connected in series in the path 33, the impedance when viewing the filter 713 side from the common junction point N is rotated clockwise to advance the phase. As a result, the impedances at the pass band frequencies of the counterpart-side filters are shifted to the inductive side.

On that occasion, the impedance when viewing the filter 713 side from the common junction point N is rotated to a larger extent on the Smith chart at each of the pass band frequencies of the counterpart-side filters as an inductance value of the inductor L731 connected in series increases. Accordingly, even in the filter 913 in the comparative example, the impedances at the pass band frequencies of the counterpart-side filters are shifted to the inductive side by increasing the inductance value of the inductor L731. However, because the inductor L731 is connected in series in the path 33 through which a radio frequency signal is transferred, an increase of the inductance value increases losses in the pass band of the filter 713.

On the other hand, according to this modification, regarding the filter 713 before adding the inductor L731, the impedances at the pass band frequencies of the counterpart-side filters are able to be rotated clockwise on the Smith chart in comparison with the filter 913 in the comparative example. Thus, the impedances at the pass band frequencies of the counterpart-side filters are able to be shifted to the inductive side with the inductor L731 having a relatively small inductance value. As a result, this modification is able to suppress the losses in the pass band of the filter 713 while satisfactory electrical characteristics are ensured.

Thus, with the multiplexer 701 according to this modification, the impedances of the (n-1) number of filters (corresponding to the two filters 712 and 713 in this modification) except for the first filter (corresponding to the filter 711 in this modification) are in the complex conjugate relationship in the pass band of the first filter (Band 41 in this modification) (see FIG. 25). Therefore, the (n-1) number of filters have, as their impedances in the pass band of the first filter, impedances having imaginary components of which absolute values are equal or substantially equal to each other and which are reversed in positive and negative signs.

Accordingly, when the (n−1) number of filters are commonly connected to each other, the imaginary components are cancelled and the combined impedance of the counterpart-side filters in the pass band of the first filter when viewed from the common junction point N has substantially no imaginary component. Hence the n number of filters after the common connection are less affected in the pass band of the first filter by the imaginary components of the impedances of the (n−1) number of filters (i.e., the filters commonly-connected with the first filter). As a result, the n number of filters after the common connection realize low losses in the filter characteristics of the first filter.

Furthermore, according to this modification, the impedances of the (n−1) number of filters (corresponding to the two filters 711 and 713 in this modification) except for the third filter (corresponding to the filter 712 in this modification) are in the complex conjugate relationship in the pass band of the third filter (Band 40 in this modification) (see FIG. 25). Therefore, the (n−1) number of filters have, as their impedances in the pass band of the third filter, impedances having imaginary components of which absolute values are equal or substantially equal to each other and which are reversed in positive and negative signs. As a result, the n number of filters after the common connection also realize low losses in the filter characteristics of the third filter as in the case of the first filter.

Moreover, according to this modification, at least one filter (e.g., the filter 713 in this modification) is a band rejection filter, and the phase adjustment circuit 723 is the inductor L731 connected in series in the path 33. With the provision of the phase adjustment circuit 723 that is the inductor L731 connected in series, the impedance when viewing the side including the band rejection filter (e.g., the filter 713 in this modification) from the common junction point N in the state not under the common connection is shifted to the inductive side at each of the pass band frequencies of the counterpart-side filters with respect to the band rejection filter (i.e., in Band 41 as the pass band of the filter 711 and Band 40 as the pass band of the filter 712 in this modification). Therefore, even when the impedances of the n number of filters are capacitive such as represented by the case where the n number of filters are each an acoustic wave filter, the impedance of the band rejection filter and the impedance of at least one of the other filters are able to be brought into the complex conjugate relationship at the pass band frequency of the first filter. As a result, satisfactory electrical characteristics are able to be obtained in the multiplexer 701 including the n number of filters including the band rejection filter.

In addition, according to this modification, the n number of filters include at least two bandpass filters (e.g., the two filters 711 and 712 in this modification) having the pass band frequencies that fall within an attenuation band frequency range of the band rejection filter. In other words, the pass band frequencies of the band rejection filter on the lower frequency side (e.g., LMB and MB in this modification) are lower than the pass band frequencies of the counterpart-side filters (e.g., Band 41 and 40 in this modification). Thus, in the band rejection filter before adding the inductor L731, the impedances at the pass band frequencies of the counterpart-side filters are able to be rotated clockwise to advance the phase on the Smith chart. Accordingly, the impedances at the pass band frequencies of the counterpart-side filters are able to be shifted to the inductive side by adding the inductor L731, which has a relatively small inductance value, to the band rejection filter. As a result, this modification is able to suppress the losses in the pass band of the band rejection filter while satisfactory electrical characteristics are ensured.

Second Preferred Embodiment

The multiplexers described above in the first preferred embodiment and the first to fifth modifications are able to be applied to a radio frequency front-end circuit including any of those multiplexers. From that point of view, in a second preferred embodiment of the present invention, such a radio frequency front-end circuit is described in connection with the case of including, for example, the multiplexer 701 according to the fifth modification of the first preferred embodiment.

Figure 29:
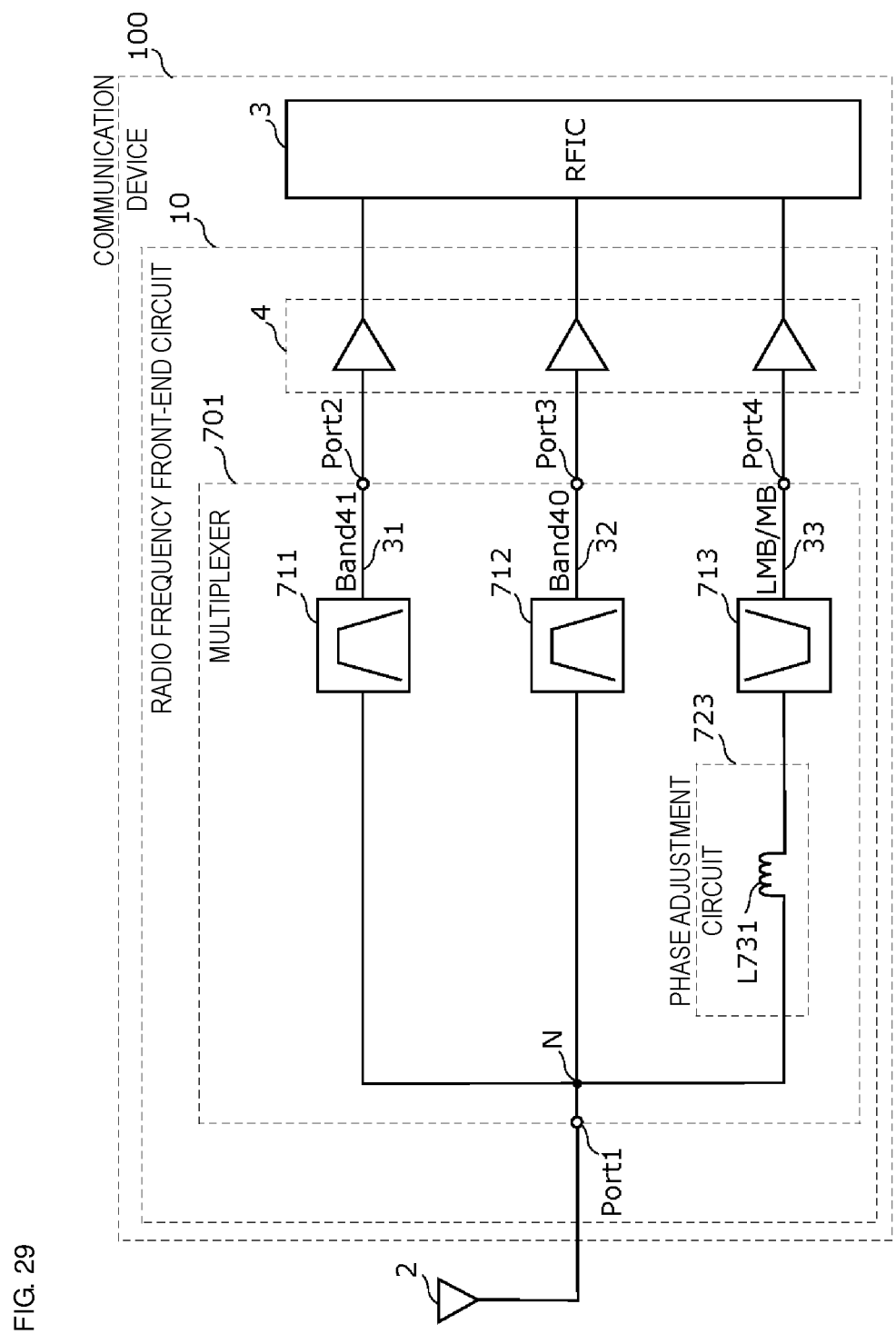
FIG. 29 is a block diagram of a radio frequency front-end circuit and a peripheral circuit thereof according to a second preferred embodiment of the present invention.

FIG. 29 is a block diagram of a radio frequency front-end circuit 10 and a peripheral circuit thereof according to the second preferred embodiment. FIG. 29 illustrates the radio frequency front-end circuit 10, which includes the multiplexer 701 and a reception amplifier circuit group 4, an antenna element 2, and an RF signal processing circuit (RFIC) 3. The radio frequency front-end circuit 10 and the RFIC 3 define a communication device 100. The antenna element 2, the radio frequency front-end circuit 10, and the RFIC 3 are located, for example, in a front-end section of a multimode/multiband adaptable cellular phone.

The antenna element 2 is a multiband adaptable antenna in conformity with communication standards, such as the LTE, the antenna transmitting and receiving a radio frequency signal. The antenna element 2 may not be adaptable for all bands of the communication device 100 in some cases, and it may be adaptable only for bands of a low-frequency band group or a high-frequency band group. Furthermore, the antenna element 2 may be incorporated in the communication device 100.

The RFIC 3 is an RF signal processing circuit that processes radio frequency signals that are transmitted and received via the antenna element 2. More specifically, the RFIC 3 executes signal processing, such as down-conversion, of a radio frequency signal (i.e., a radio frequency reception signal in this case) that is input from the antenna element 2 via a reception-side signal path in the radio frequency front-end circuit 10, and then outputs a reception signal, which is produced through the signal processing, to a base-band signal processing circuit (not illustrated). Furthermore, the RFIC 3 executes signal processing, such as up-conversion, of a transmission signal that is input from the base-band signal processing circuit, and then outputs a radio frequency signal (i.e., a radio frequency transmission signal in this case), which is produced through the signal processing, to a transmission-side signal path (not illustrated) in the radio frequency front-end circuit 10.

The radio frequency front-end circuit 10 is a circuit that transfers radio frequency signals between the antenna element 2 and the RFIC 3. More specifically, the radio frequency front-end circuit 10 transfers a high frequency signal output from the RFIC 3 (i.e., a radio frequency transmission signal in this case) to the antenna element 2 via the transmission-side signal path (not illustrated). The radio frequency front-end circuit 10 further transfers a high frequency signal received by the antenna element 2 (i.e., a radio frequency reception signal in this case) to the RFIC 3 via the reception-side signal path.

The radio frequency front-end circuit 10 includes the multiplexer 701 and the reception amplifier circuit group 4, which are arranged in the mentioned order from the side including the antenna element 2.

The reception amplifier circuit group 4 includes one or more low-noise amplifiers (a plurality of low-noise amplifiers in this embodiment) that amplify electrical power of the radio frequency reception signal that is input from the multiplexer 701.

The radio frequency front-end circuit 10 may further include, for example, a switch that switches over transmission and reception, or a switch that allows a low-noise amplifier to be shared by the plurality of filters 711 to 712 of the multiplexer 701.

The radio frequency front-end circuit 10 having the above-described configuration executes filtering of the high frequency signal input from the antenna element 2 (i.e., the radio frequency reception signal in this case) through a predetermined filter, amplifies it through the predetermined low-noise amplifier, and then outputs the amplified signal to the RFIC 3. It is to be noted that an RFIC adapted for low frequency bands (LMB and MB in this embodiment) and an RFIC adapted for high frequency bands (Band 41 and 40) in this preferred embodiment) may be disposed separately.

Thus, since the radio frequency front-end circuit 10 includes the multiplexer 701 according to the fifth modification of the first preferred embodiment, it is able to be realized as a radio frequency front-end circuit capable of providing satisfactory electrical characteristics (namely, suppressing losses) and being adapted for three or more multiple bands.

The radio frequency front-end circuit may include any of the multiplexers according to the first preferred embodiment and the first to fourth modifications. The second preferred embodiment has been described above as having the configuration in which the multiplexer is disposed in the reception-side signal path. However, the configuration of the radio frequency front-end circuit is not limited to the above-described one, and the multiplexer may be disposed in the transmission-side signal path.

Other Preferred Embodiments

While the multiplexers and the radio frequency front-end circuits according to the present invention have been described above in connection with the preferred embodiments and the modifications, the present invention is not limited to those preferred embodiments and modifications. The present invention further includes other preferred embodiments that are implemented by combining optional elements or features of the above-described preferred embodiments and modifications, other modifications that are obtained by modifying the above-described preferred embodiments in various ways, which are conceivable by those skilled in the art, within the scope not departing from the gist of the present invention, and various devices that include the multiplexers and the radio frequency front-end circuits according to the present invention.

By way of example, the communication device 100 including the radio frequency front-end circuit 10 and the RFIC 3 (RF signal processing circuit) is also included in preferred embodiments of the present invention. That communication device 100 is able to be realized as a communication device capable of providing satisfactory electrical characteristics (namely, suppressing losses) and being adapted for three or more multiple bands.

In the above description, one or more phase adjustment circuits preferably are disposed between the common junction point N and the n number of filters (e.g., the three filters 11 to 13 in the above description). However, when the above-described complex conjugate relationship is satisfied only with the n number of filters, namely when the n number of filters are able to be designed in a manner of satisfying the above-described complex conjugate relationship, the one or more phase adjustment circuits may be omitted. Furthermore, the n number of filters may satisfy the following relationship on an assumption that an arbitrary one among the n number of filters is the first filter. The impedances of the (n−1) number of individual filters except for the first filter are in the complex conjugate relationship in the pass band of the first filter when viewing the side including the n number of filters from the common junction point in the state where the n number of paths are not commonly connected. Stated in another way, when viewing the side including the n number of filters in the above-mentioned manner, (n−1) filters among the n number of filters except for the first filter have impedances of which imaginary components cancel each other at the pass band frequency of the first filter.

Figure 30A:
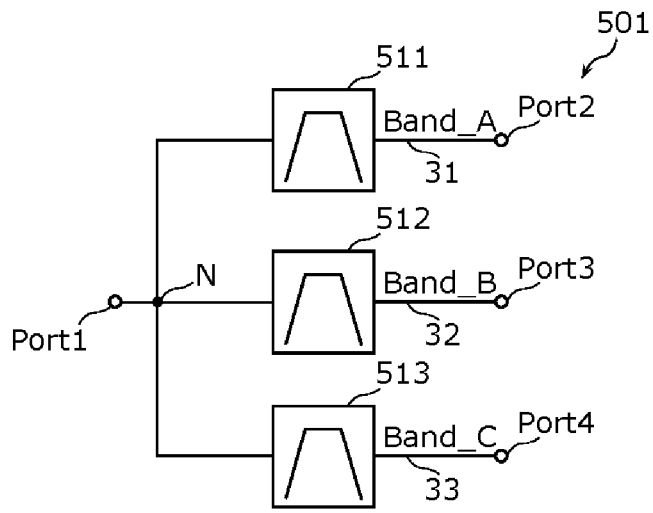
FIG. 30A is a first block diagram of a multiplexer according to another preferred embodiment of the present invention.
Figure 30B:
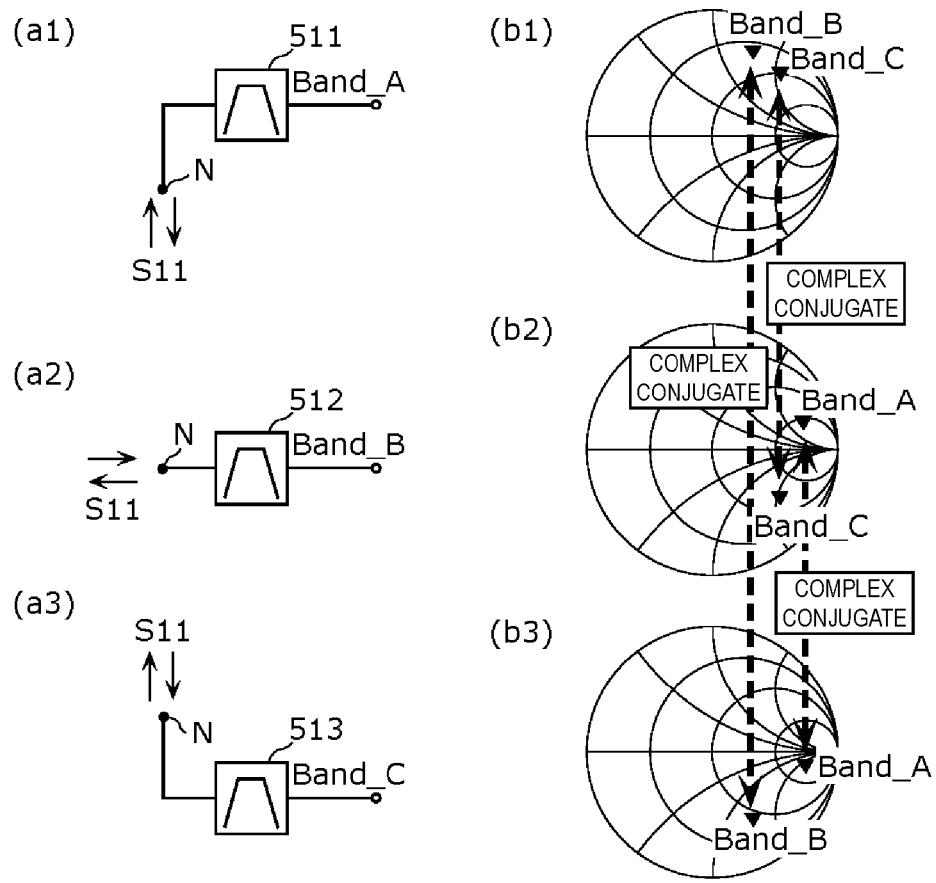
FIG. 30B illustrates Smith charts representing reflection characteristics when viewing the filter side from the common junction point before the common connection in the multiplexer illustrated in FIG. 30A.

FIG. 30A is a block diagram of a multiplexer 501 including the above-mentioned filters 511 to 513. The filters 511 to 513 are filters having pass bands of Band_A, Band_B, and Band_C, respectively, in the mentioned order. FIG. 30B illustrates Smith charts representing reflection characteristics when viewing the side including the filters 511 to 513 from the common junction point N before the common connection in the multiplexer 501 illustrated in FIG. 30A. As illustrated in FIG. 30B, regarding each of Band_A, Band_B, and Band_C, the impedances of two filters in the pass bands of the counterpart-side filters with respect to the relevant Band are in the complex conjugate relationship in the relevant Band.

The above description is made in connection with the case where the multiplexer includes three filters, for example. However, the multiplexer may include four or more filters, for example. In other words, the number of filters that are in the "complex conjugate relationship" may be three or more, for example. More specifically, while, in the above description, the complex conjugate relationship is satisfied by filters in a one-to-one relationship, the complex conjugate relationship may be satisfied by filters in a one-to-plural relationship or in a plural-to-plural relationship. For easier understanding of the above point, the following description is made in connection with an example in which the multiplexer includes four filters.

Figure 31A:
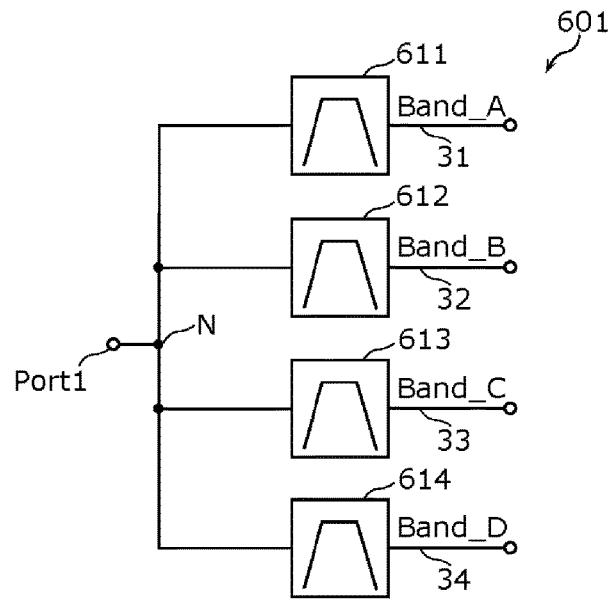
FIG. 31A is a second block diagram of a multiplexer according to still another preferred embodiment of the present invention.
Figure 31B:
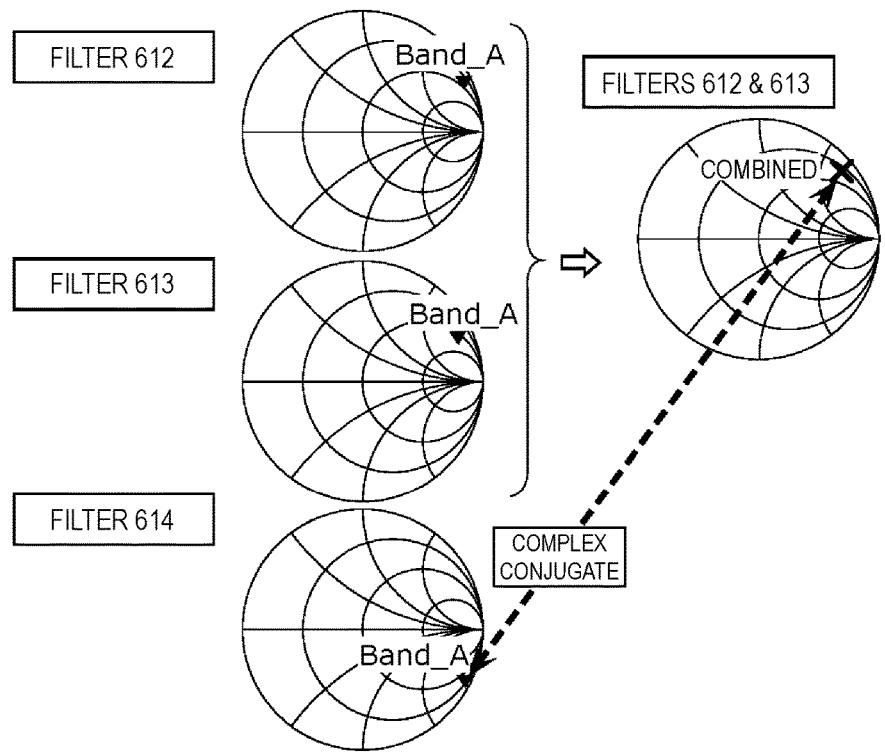
FIG. 31B illustrates Smith charts representing reflection characteristics when viewing the filter side from the common junction point before the common connection in the multiplexer illustrated in FIG. 31A.

FIG. 31A is a block diagram of a multiplexer 601 including four filters 611 to 614, for example. The filters 611 to 614 are filters having pass bands of Band_A, Band_B, Band_C, and Band_D, respectively, in the mentioned order. FIG. 31B illustrates Smith charts representing reflection characteristics when viewing the side including the filters 611 to 614 from the common junction point N before the common connection in the multiplexer 601 illustrated in FIG. 31A. FIG. 31B indicates, for the filters 612 to 614 except for the filter 611 of which pass band is Band_A, their impedances in Band_A (see markers denoted by triangles in FIG. 31B).

As seen from FIG. 31B, focusing Band_A that is the pass band of the filter 611, the impedances of the filters 612 to 614, which are the filters commonly-connected with the filter 611, are in the complex conjugate relationship in Band_A. More specifically, the combined impedance (see a marker denoted by x in FIG. 31B) of the filters 612 and 613 of which impedances in Band_A are positioned on the inductive side is in the complex conjugate relationship to the impedance of the filter 614, which is positioned on the capacitive side.

Stated in another way, in the case of the multiplexer including the number n (four or more) of filters, regarding (n−1) filters among the n number of filters except for the first filter (e.g., the filter 611), the combined impedance of a first filter group (e.g., the filters 612 and 613 here) and the impedance of a second filter group (e.g., the filter 614 here) are in the complex conjugate relationship in the pass band of the first filter (e.g., in Band_A here) when viewing the individual filters in the separated state from the common junction point N. The multiplexer 601 also provides similar advantageous effects to those in the first preferred embodiment with the feature of satisfying the above-described complex conjugate relationship.

Thus, the expression "the impedances of the (n−1) number of filters are in the complex conjugate relationship" implies that (i) the combined impedance of one or more filters, each having an inductive reactance or an inductive susceptance, among the (n−1) number of filters and (ii) the combined impedance of one or more filters, each having a capacitive reactance or a capacitive susceptance, among the (n−1) number of filters are in the complex conjugate relationship.

Furthermore, the above description is made in connection with an example in which the combination of the pass bands assigned to the filters 11 to 13 includes Band 3, Band 1, and Band 7, for example. However, the combination of the pass bands are not limited the above-described one, and it may be provided, for example, as (i) a combination of Band 3, Band 1, and Band 40, (ii) a combination of Band 3, Band 1, and Band 41, (iii) a combination of Band 2, Band 4, and Band 30, (iv) a combination of Band 2, Band 4, and Band 7, (v) a combination of Band 25, Band 66, and Band 30, or (vi) a combination of Band 4, Band 25, and Band 30.

While the filters 11 to 13 have been described above as being all reception filters, for example, at least one of those filters may be a transmission filter. In an example, the filters 11 to 13 may include a transmission filter and a reception filter adapted for Band 4 of the LTE (transmission band: about 1710 MHz to about 1755 MHz and reception band: about 2110 MHz to about 2155 MHz) in which a transmission band (Tx) and a reception band (Rx) are relatively spaced from each other, for example.

In any of the multiplexers described above, an impedance element, such as an inductor, that provides impedance matching may be connected in the path interconnecting the common junction point N and the common terminal Port1.

Moreover, a preferred embodiment of the present invention may be implemented as a multiplexer design method. In more detail, the multiplexer design method is a method of designing a multiplexer including the number n (n is an integer equal to three or more) of filters that are individually provided in the n number of paths commonly connected at the common junction point N, and that have different pass bands from one another, the method including a first step of designing a first filter among the n number of filters, and a second step of designing (n−1) filters among the n number of filters except for the first filter. In the second step, the (n−1) number of filters are designed such that imaginary components of their impedances cancel each other in the pass band of the first filter when viewing the side including the n number of filters from a point, which is part of the n number of paths and which is to be the common junction point N.

The above-described multiplexer design method is carried out, for example, using a computer such as a CAD device, or a computer incorporating an automatic tool such as EDA (Electronic Design Automation). Moreover, the multiplexer design method may be carried out in a computer through dialog operations between a designer and the computer.

The sequence in which the first step and the second step are executed is not limited to particular one. Those steps are not always required to be executed in sequence, and they may be executed at the same time.

The preferred embodiments of the present invention are able to be utilized, as small-sized multiplexers adaptable for multiband systems, to a wide variety of communication devices including cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   n number of filters that are individually provided in n number of paths commonly connected at a common junction point, and that have different pass bands from one another;
   wherein
   n is an integer equal to three or more;
   (n−1) filters among the n number of filters except for a first filter have impedances of which imaginary components cancel each other at a pass band frequency of the first filter when viewed from the common junction point in a state of the n number of paths being not commonly connected;
   each of the n number of filters is an acoustic wave filter includes an acoustic wave resonator; and
   the pass band frequency of the first filter is different from a frequency range sandwiched between a resonant frequency and an antiresonant frequency of the acoustic wave resonator of each of the (n−1) number of filters.

2. The multiplexer according to claim 1, wherein the impedances of the (n−1) number of filters are in a complex conjugate relationship at the pass band frequency of the first filter when viewed from the common junction point in the state of the n number of paths being not commonly connected.

3. The multiplexer according to claim 1, wherein at least two among the n number of filters except for the first filter have impedances of which imaginary components cancel each other at the pass band frequency of the first filter when viewed from the common junction point in the state of the n number of paths being not commonly connected.

4. The multiplexer according to claim 3, wherein the impedances of the at least two filters are in a complex conjugate relationship at the pass band frequency of the first filter when viewed from the common junction point in the state of the n number of paths being not commonly connected.

5. The multiplexer according to claim 1, wherein the (n−1) filters have impedances of which imaginary components cancel each other at the pass band frequency of the first filter on an open side, which is a region on a right side of a center of a Smith chart, when viewed from the common junction point in the state of the n number of paths being not commonly connected.

6. The multiplexer according to claim 3, wherein the at least two filters have impedances of which imaginary components cancel each other at the pass band frequency of the first filter on an open side, which is a region on a right side of a center of a Smith chart, when viewed from the common junction point in the state of the n number of paths being not commonly connected.

7. The multiplexer according to claim 1, wherein regarding (n−1) filters among the n number of filters except for a second filter, absolute values of the impedances at a pass band frequency of the second filter are not less than about 500Ω when viewed from the common junction point in the state of the n number of paths being not commonly connected.

8. The multiplexer according to claim 1, wherein (n−1) filters among the n number of filters except for a third filter have impedances of which imaginary components cancel each other at a pass band frequency of the third filter when viewed from the common junction point in the state of the n number of paths being not commonly connected.

9. The multiplexer according to claim 8, wherein the impedances of (n−1) filters among the n number of filters except for the third filter are in a complex conjugate relationship at the pass band frequency of the third filter when viewed from the common junction point in the state of the n number of paths being not commonly connected.

10. The multiplexer according to claim 1, wherein
n=3 is satisfied;
the n number of filters include a first filter having a first frequency band as a pass band, a second filter having a second frequency band as a pass band, and a third filter having a third frequency band as a pass band; and
the second filter and the third filter have impedances of which imaginary components cancel each other in the first frequency band when viewed from the common junction point in the state of the n number of paths being not commonly connected.

11. The multiplexer according to claim 10, wherein an impedance of the first filter in the second frequency band and an impedance of the third filter in the second frequency band have absolute values of not less than about 500Ω when viewing a side including the n number of filters from the common junction point in the state of the n number of paths being not commonly connected.

12. The multiplexer according to claim 10, wherein the impedance of the second filter in the first frequency band and the impedance of the third filter in the first frequency band are in a complex conjugate relationship when viewing a side including the n number of filters from the common junction point in the state of the n number of paths being not commonly connected.

13. The multiplexer according to claim 10, wherein the first filter and the second filter have impedances of which imaginary components cancel each other in the third frequency band when viewed from the common junction point in the state of the n number of paths being not commonly connected.

14. The multiplexer according to claim 13, wherein the impedance of the first filter in the third frequency band and the impedance of the second filter in the third frequency band are in a complex conjugate relationship when viewing the side including the n number of filters from the common junction point in the state of the n number of paths being not commonly connected.

15. The multiplexer according to claim 1, wherein when the pass bands of the n number of filters are arrayed in order of pass band frequency, the pass band frequency of the first filter corresponds to a band other than the pass bands that are positioned at a lowest frequency level and a highest frequency level.

16. The multiplexer according to claim 1, further comprising a phase adjustment circuit that is disposed between the common junction point and at least one among the n number of filters.

17. The multiplexer according to claim 16, wherein the phase adjustment circuit includes a microstripline connected in series in at least one of the paths in which the at least one filter is disposed.

18. The multiplexer according to claim 16, wherein
the at least one filter is a band rejection filter; and
the phase adjustment circuit includes an inductor connected between the common junction point and the band rejection filter in series in the path in which the band rejection filter is disposed.

19. The multiplexer according to claim 18, wherein the n number of filters include at least two bandpass filters having pass band frequencies that fall within an attenuation band frequency range of the band rejection filter.

20. The multiplexer according to claim 18, wherein
the acoustic wave resonator of the band rejection filter includes one or more acoustic wave resonators; and
one of the one or more acoustic wave resonators of the band rejection filter closest to the common junction point is a parallel resonator that is connected in series in a path interconnecting the path in which the band rejection filter is disposed and a ground.

21. The multiplexer according to claim 16, wherein the phase adjustment circuit is an LC matching circuit including one or more inductors and one or more capacitors.

22. The multiplexer according to claim 16, wherein the phase adjustment circuit includes a capacitor connected in series in at least one of the paths in which the at least one filter is disposed, and an inductor connected in series in a path interconnecting the at least one path and a ground.

23. The multiplexer according to claim 1, wherein the pass band of the first filter is apart from the pass bands of the (n−1) filters in excess of a pass band width of the first filter.

24. The multiplexer according to claim 1, wherein
the n number of filters are three filters; and
the three filters include a filter having a pass band given as Band 3 of LTE (Long Term Evolution), a filter having a pass band given as Band 1 of the LTE, and a filter having a pass band given as Band 7 of the LTE.

25. The multiplexer according to claim 1, wherein
the multiplexer is structure to perform a carrier aggregation technique of simultaneously transmitting and receiving radio frequency signals in a plurality of frequency bands; and
the n number of filters perform filtering of the radio frequency signals simultaneously.

26. A radio frequency front-end circuit comprising:
the multiplexer according to claim 1; and
an amplifier circuit connected to the multiplexer.

27. A communication device comprising:
an RF signal processing circuit that processes radio frequency signals transmitted and received via an antenna element; and
the radio frequency front-end circuit according to claim 26, which transfers the radio frequency signals between the antenna element and the RF signal processing circuit.

28. A method of designing a multiplexer including n number of filters that are individually provided in n number of paths commonly connected at a common junction point, and that have different pass bands from one another, where n is an integer equal to three or more, the method comprising:
a first step of designing a first filter among the n number of filters; and
a second step of designing (n−1) filters among the n number of filters except for the first filter; wherein in the second step, the (n−1) number of filters are designed such that imaginary components of impedances of the (n−1) number of filters cancel each other at a pass band frequency of the first filter when viewing a side including the n number of filters from a point, which is part of the n number of paths and which is to be the common junction point;

each of the n number of filters is an acoustic wave filter includes an acoustic wave resonator; and the pass band frequency of the first filter is different from a frequency range sandwiched between a resonant frequency and an antiresonant frequency of the acoustic wave resonator of each of the (n−1) number of filters.

* * * * *